(12) United States Patent
Lin et al.

(10) Patent No.: US 12,532,771 B2
(45) Date of Patent: Jan. 20, 2026

(54) PACKAGE STRUCTURE WITH FAN-OUT FEATURE

(71) Applicant: Taiwan Semiconductor Manufacturing Company, Ltd., Hsinchu (TW)

(72) Inventors: Meng-Liang Lin, Hsinchu (TW); Po-Hao Tsai, Taoyuan (TW); Po-Yao Chuang, Hsin-Chu (TW); Yi-Wen Wu, New Taipei (TW); Techi Wong, Zhubei (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 45 days.

(21) Appl. No.: 17/838,434

(22) Filed: Jun. 13, 2022

(65) Prior Publication Data
US 2022/0310468 A1    Sep. 29, 2022

Related U.S. Application Data

(62) Division of application No. 16/654,187, filed on Oct. 16, 2019, now Pat. No. 11,362,010.

(51) Int. Cl.
*H01L 23/31* (2006.01)
*H01L 21/48* (2006.01)
(Continued)

(52) U.S. Cl.
CPC ...... *H01L 23/3185* (2013.01); *H01L 21/4853* (2013.01); *H01L 21/56* (2013.01); *H01L 23/24* (2013.01); *H01L 23/3107* (2013.01); *H01L 23/49811* (2013.01); *H01L 24/16* (2013.01); *H01L 25/0657* (2013.01); *H01L 25/16* (2013.01); *H01L 25/18* (2013.01); *H01L 23/49822* (2013.01);
(Continued)

(58) Field of Classification Search
None
See application file for complete search history.

(56) References Cited

U.S. PATENT DOCUMENTS 7,795,721 B2    9/2010    Kurita
8,778,738 B1    7/2014    Lin et al.
(Continued)

OTHER PUBLICATIONS

1 Chinese language office action dated Jun. 16, 2021, issued in application No. TW 109132537.

*Primary Examiner* — Nilufa Rahim
(74) *Attorney, Agent, or Firm* — McClure, Qualey & Rodack, LLP

(57) ABSTRACT

A package structure is provided. The package structure includes a redistribution structure, and the redistribution structure has multiple insulating layers and multiple conductive features. The package structure also includes a semiconductor die and a device element over opposite surfaces of the redistribution structure. The package structure further includes a first protective layer at least partially surrounding the semiconductor die. In addition, the package structure includes a second protective layer at least partially surrounding the device element. The second protective layer is thicker than the first protective layer, and the second protective layer and the first protective layer have different coefficients of thermal expansion.

20 Claims, 38 Drawing Sheets

(51) Int. Cl.

| | |
|---|---|
| *H01L 21/56* | (2006.01) |
| *H01L 23/00* | (2006.01) |
| *H01L 23/24* | (2006.01) |
| *H01L 23/498* | (2006.01) |
| *H01L 25/065* | (2023.01) |
| *H01L 25/16* | (2023.01) |
| *H01L 25/18* | (2023.01) |

(52) U.S. Cl.
CPC ............ *H01L 2224/16225* (2013.01); *H01L 2225/06517* (2013.01); *H01L 2225/06572* (2013.01); *H01L 2924/19106* (2013.01)

(56) References Cited

U.S. PATENT DOCUMENTS

| | | |
|---|---|---|
| 8,986,806 B1 | 3/2015 | Baloglu et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2007/0152326 A1* | 7/2007 | Lim .................. H01L 23/3128 257/E21.503 |
| 2010/0078819 A1 | 4/2010 | Shin et al. |
| 2010/0320624 A1* | 12/2010 | Kang ................ H01L 23/5389 257/E23.116 |
| 2011/0117700 A1* | 5/2011 | Weng .................... H01L 21/56 438/109 |
| 2012/0153509 A1* | 6/2012 | Kyozuka ............ H01L 25/0657 257/784 |
| 2014/0077381 A1 | 3/2014 | Lin et al. |
| 2014/0077385 A1 | 3/2014 | Harper |
| 2016/0233196 A1* | 8/2016 | Kim .................... H01L 25/105 |
| 2016/0276307 A1 | 9/2016 | Lin |
| 2017/0117264 A1* | 4/2017 | Lee .................... H01L 23/5389 |
| 2017/0207182 A1* | 7/2017 | Ho .................... H01L 21/76898 |
| 2017/0294389 A1 | 10/2017 | Factor et al. |
| 2017/0309572 A1 | 10/2017 | Chi et al. |
| 2018/0061811 A1* | 3/2018 | Shen ...................... H01L 25/50 |
| 2018/0261573 A1* | 9/2018 | Chen .................. H01L 21/6835 |
| 2018/0294247 A1 | 10/2018 | Hung et al. |
| 2019/0139907 A1 | 5/2019 | Lin et al. |
| 2019/0164863 A1* | 5/2019 | Cho ...................... H01L 24/32 |
| 2020/0321293 A1* | 10/2020 | Kim .................... H01L 24/16 |
| 2021/0043604 A1 | 2/2021 | Fang |
| 2021/0066273 A1* | 3/2021 | Myasishchev ...... H01L 23/3135 |
| 2021/0111088 A1* | 4/2021 | Jain .................. H01L 23/53295 |

* cited by examiner

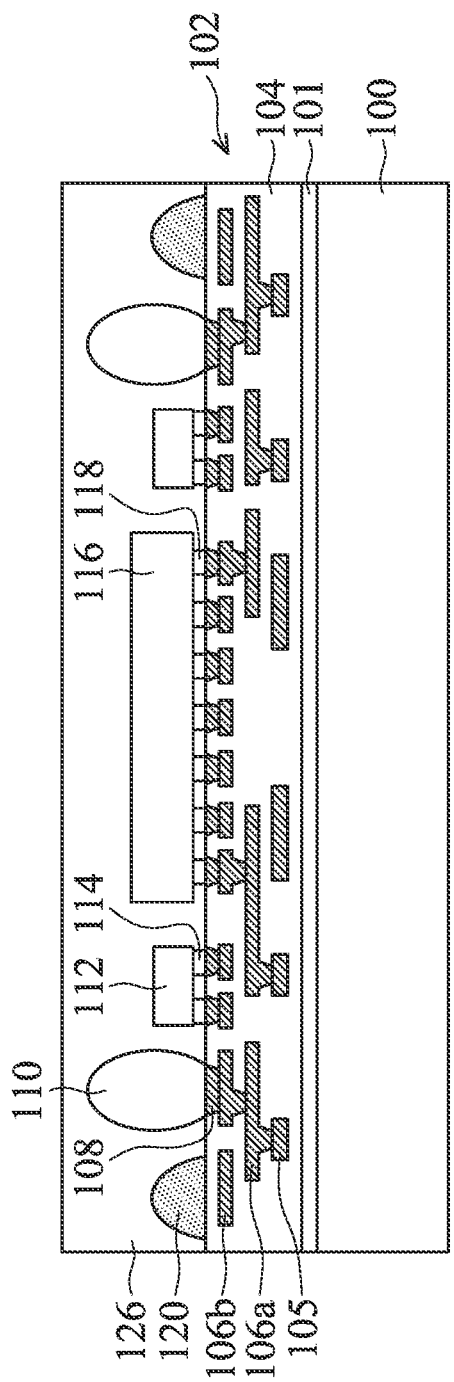
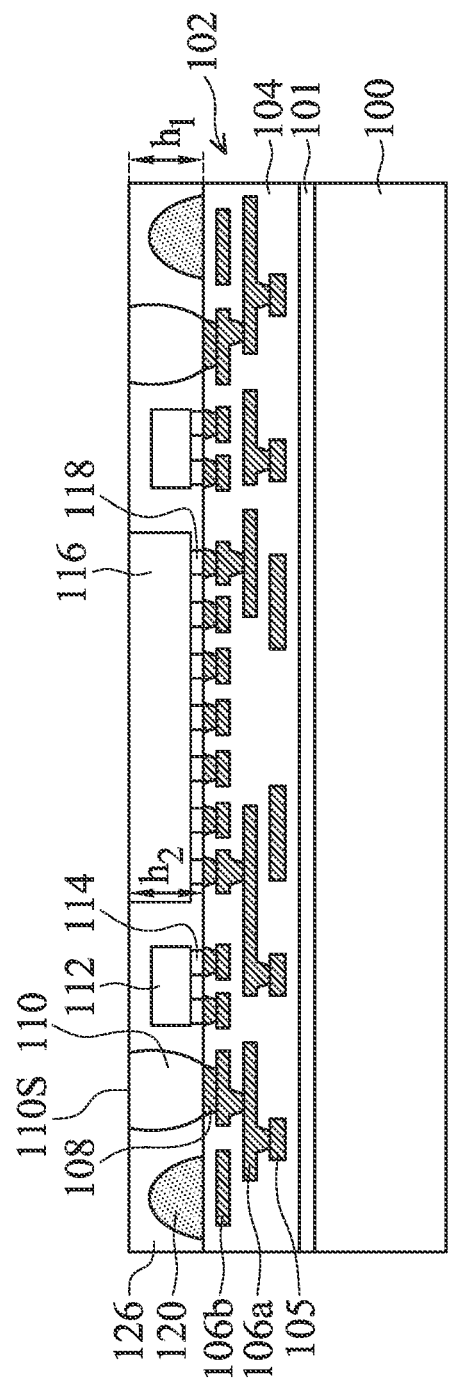
FIG. 1E
FIG. 1F

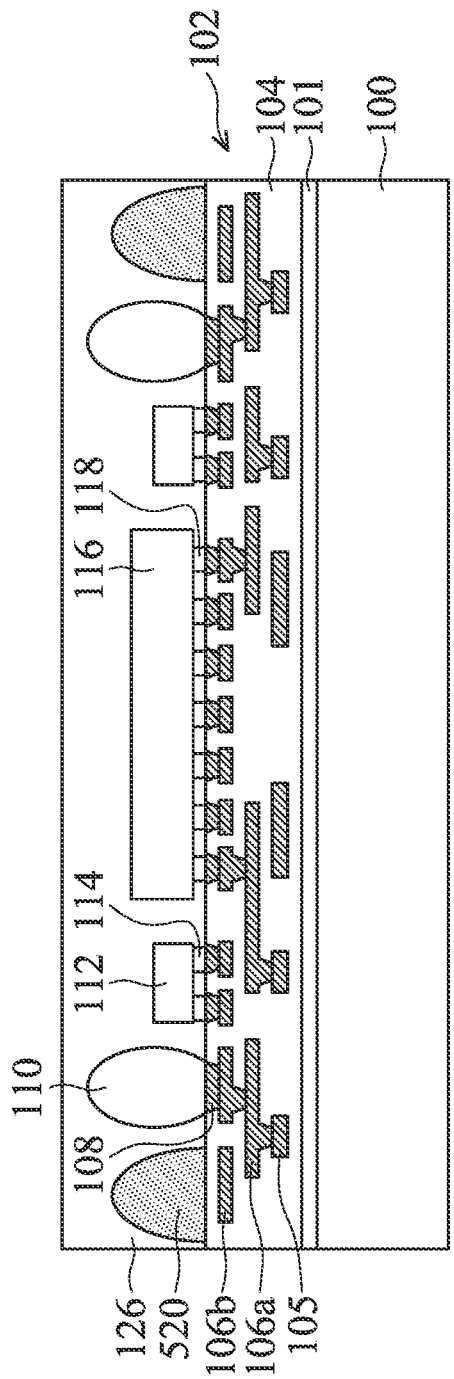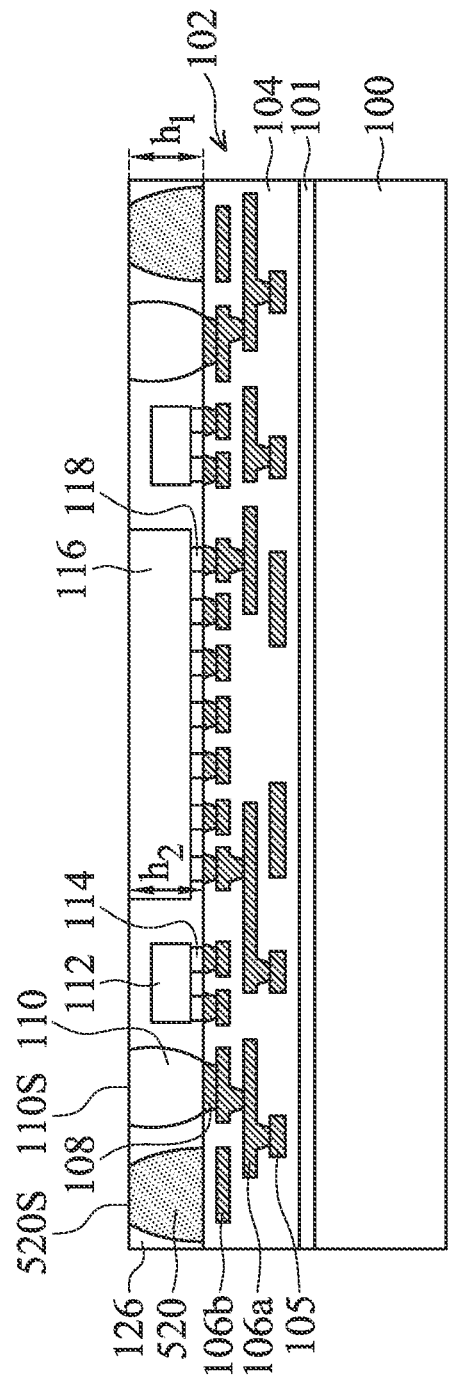

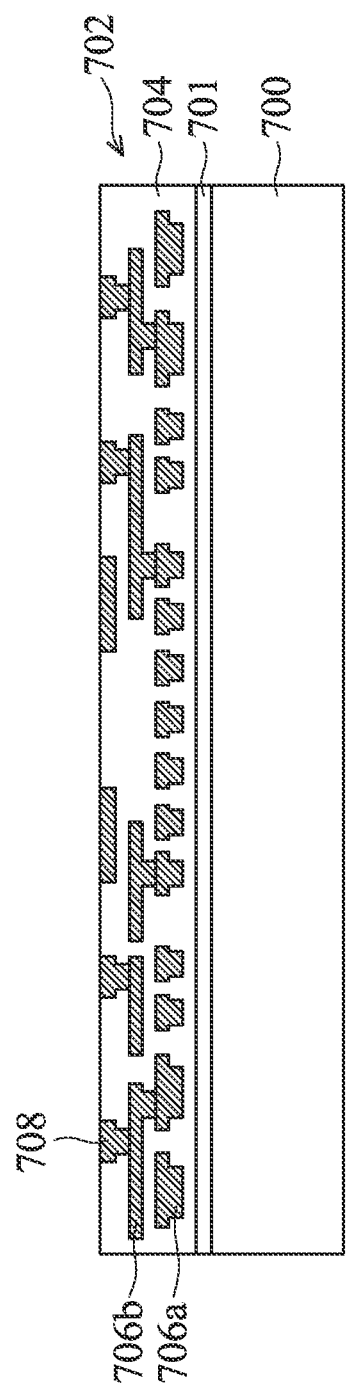
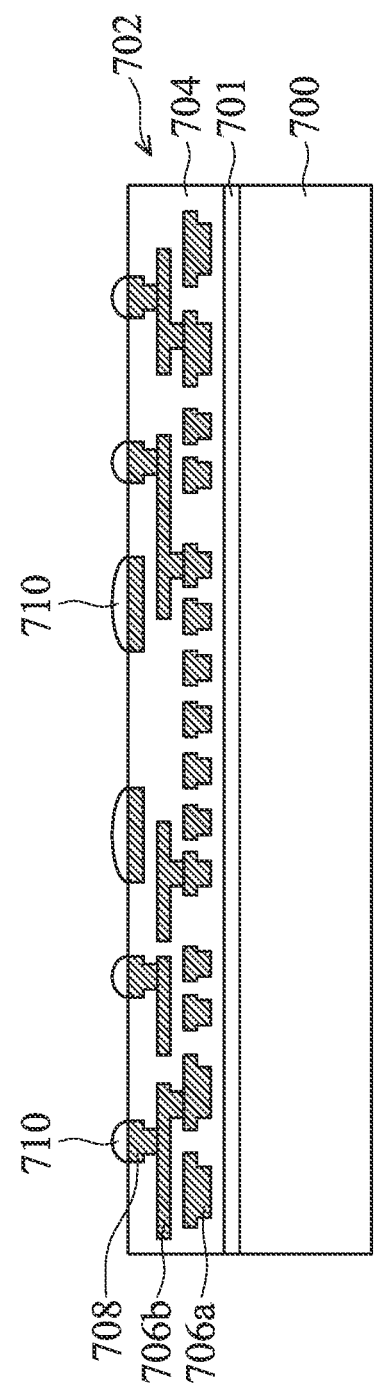
FIG. 7A
FIG. 7B

PACKAGE STRUCTURE WITH FAN-OUT FEATURE

PRIORITY CLAIM AND CROSS-REFERENCE

This application is a Divisional of U.S. application Ser. No. 16/654,187, filed on Oct. 16, 2019, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize a smaller area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 5A-5E are cross-sectional views of various stages of a process for forming a package structure, in accordance with some embodiments.

FIGS. 7A-7L are cross-sectional views of various stages of a process for forming a package structure, in accordance with some embodiments.

DETAILED DESCRIPTION

Figure 1A:
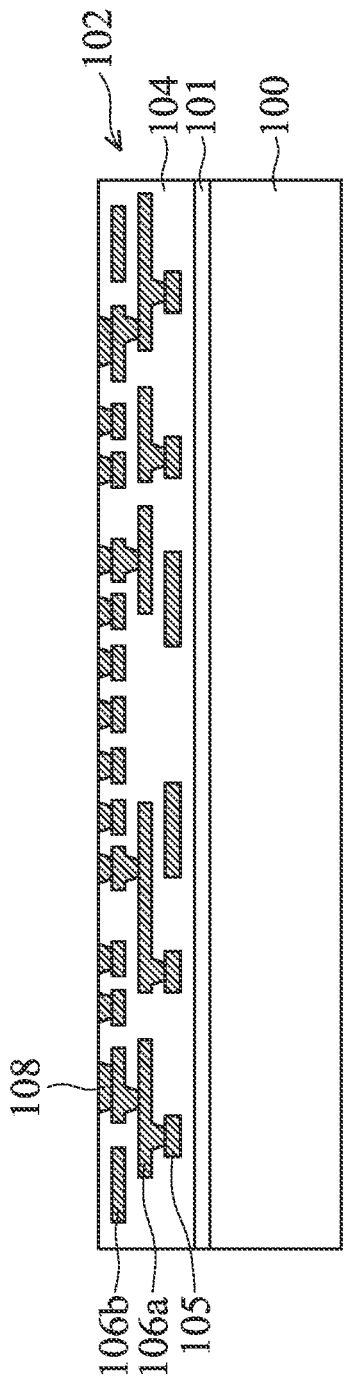
FIGS. 1A-1R are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
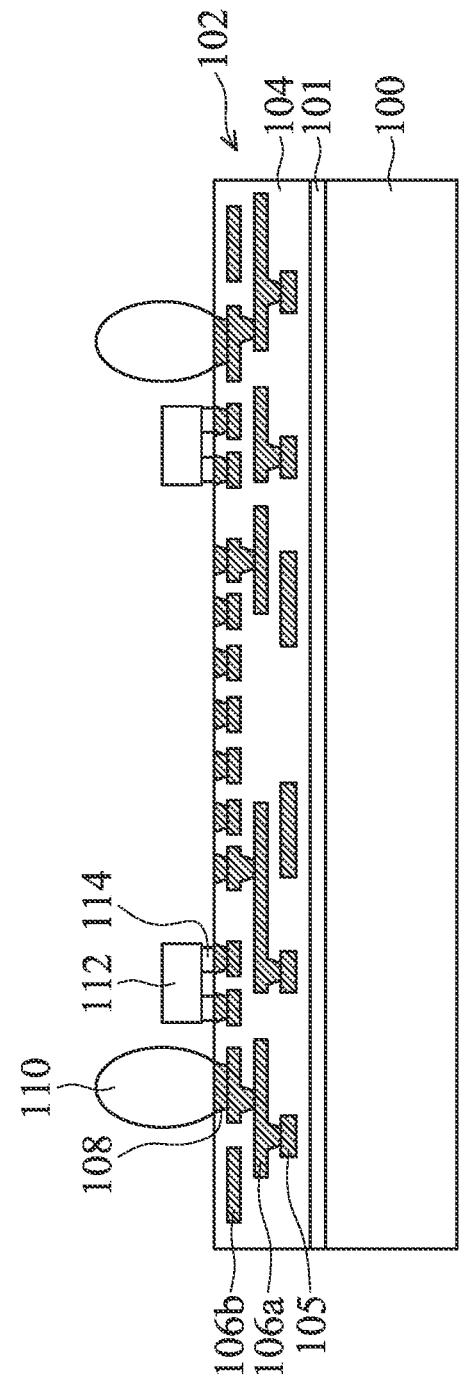
Figure 1C:
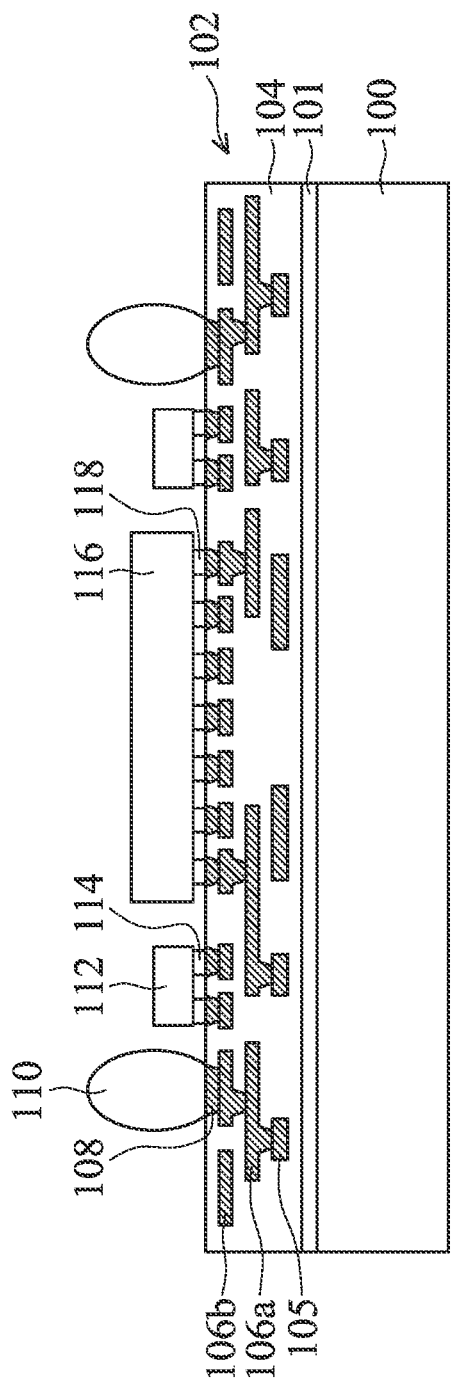
Figure 1D:
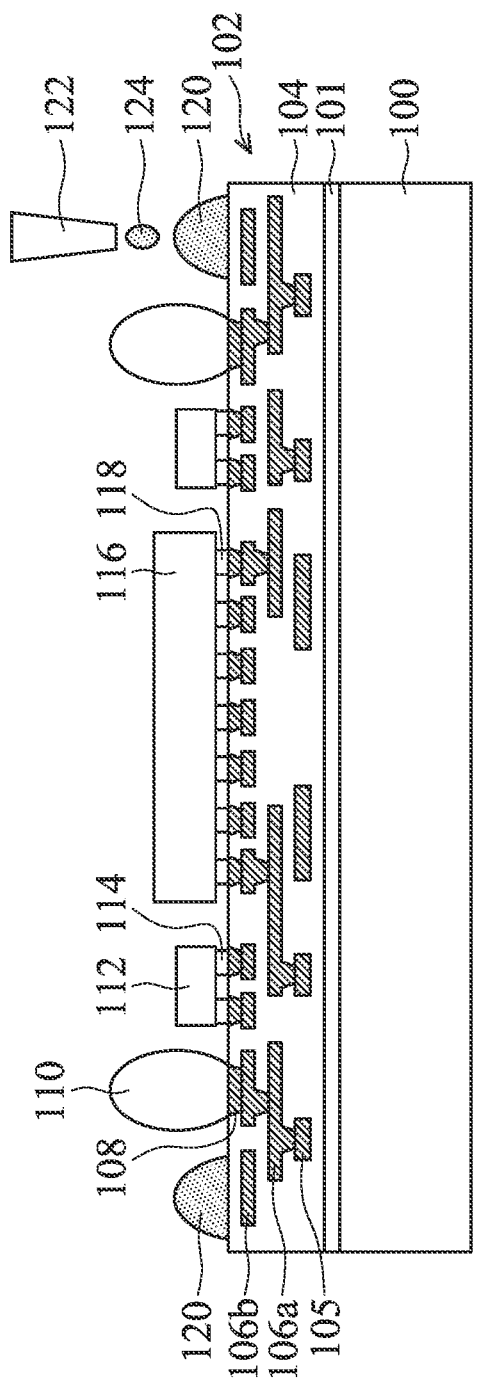
Figure 1G:
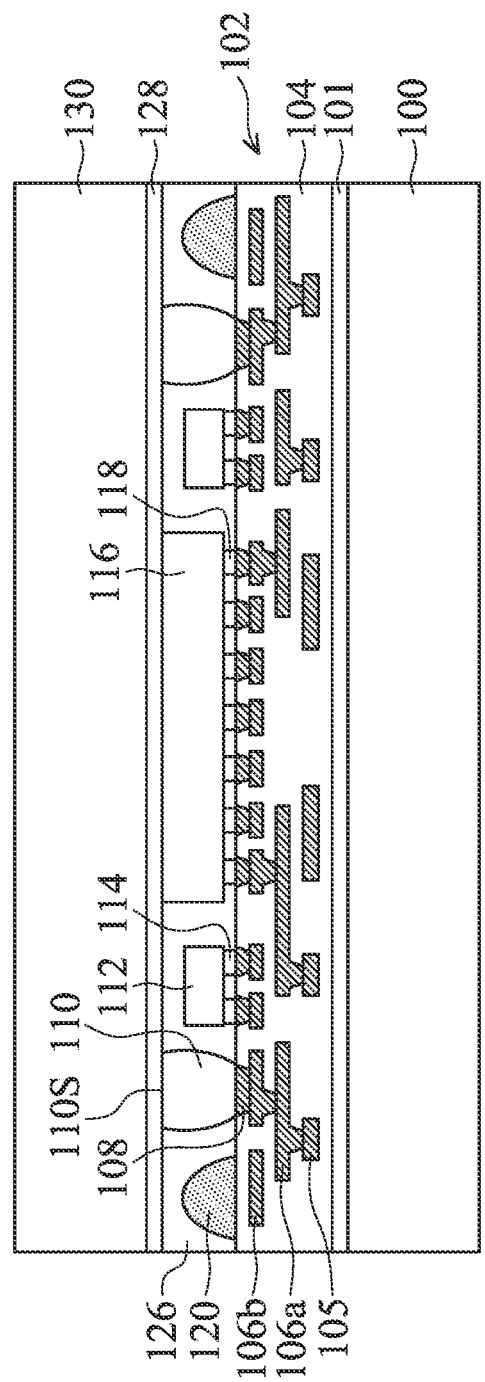
Figure 1H:
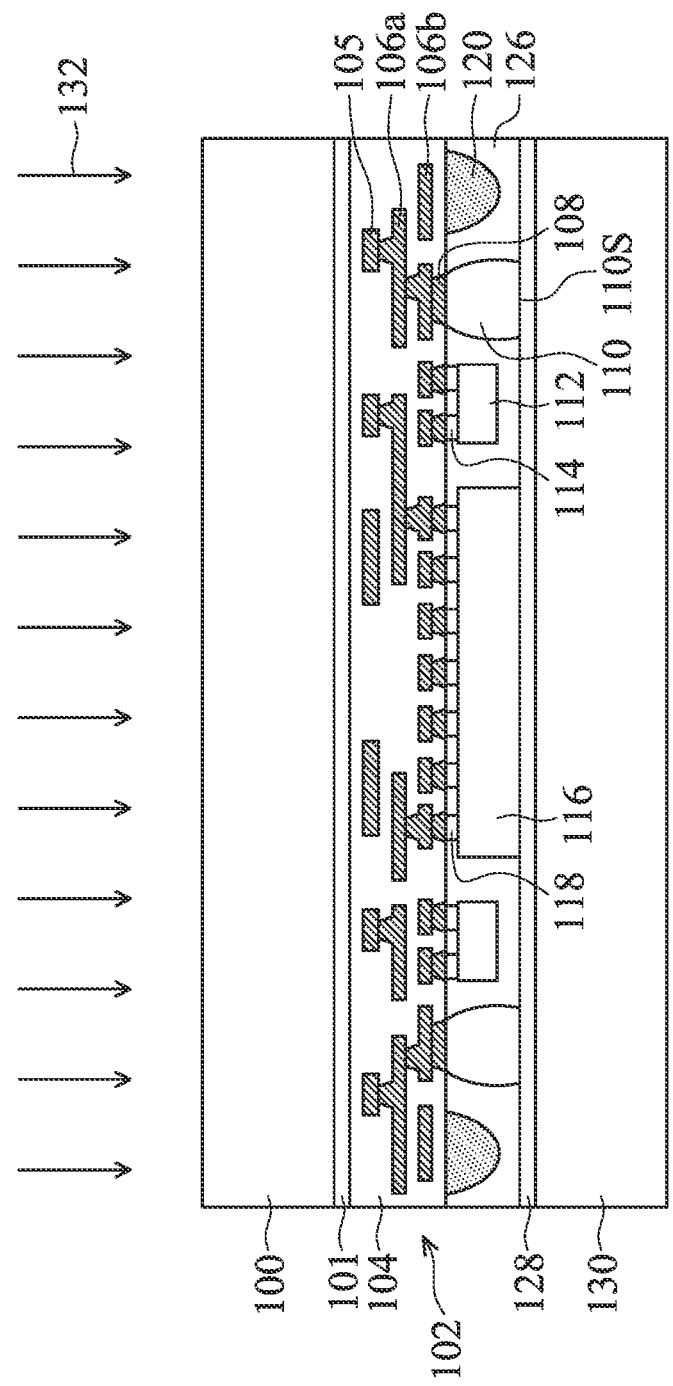
Figure 1I:
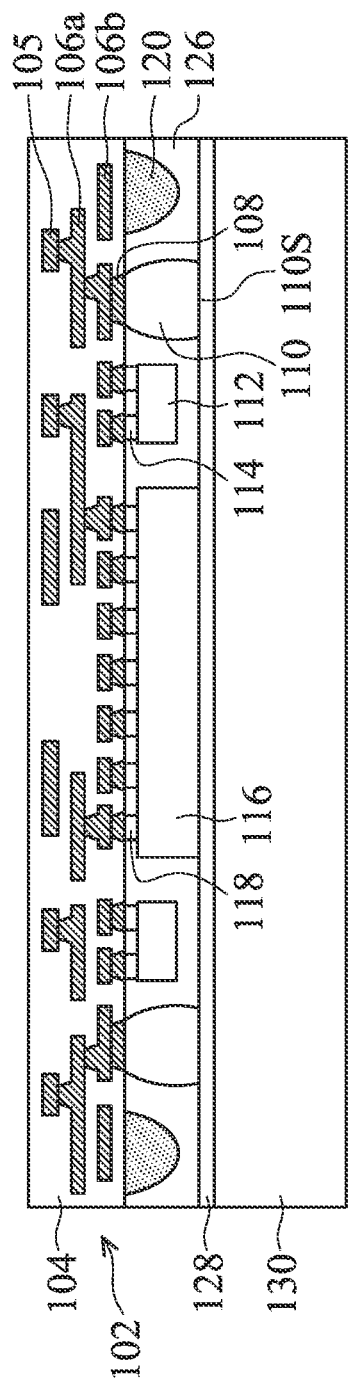
Figure 1J:
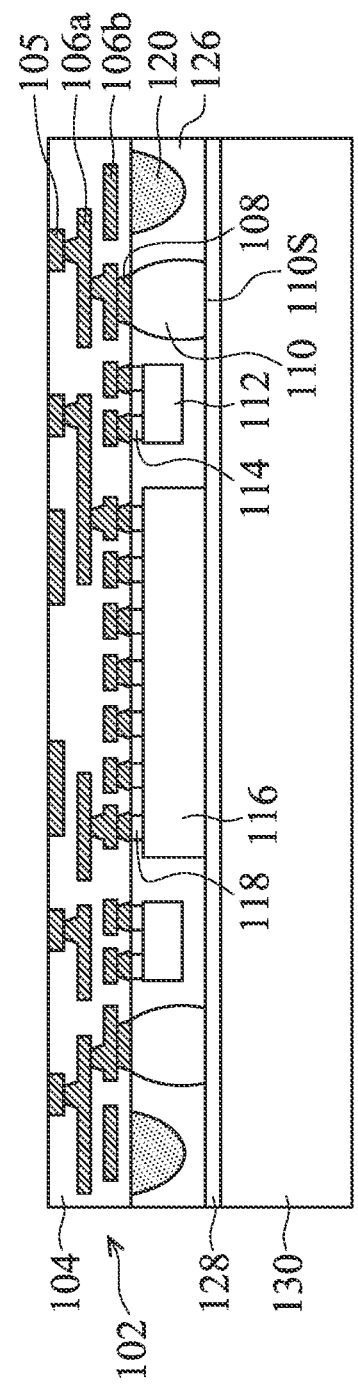
Figure 1K:
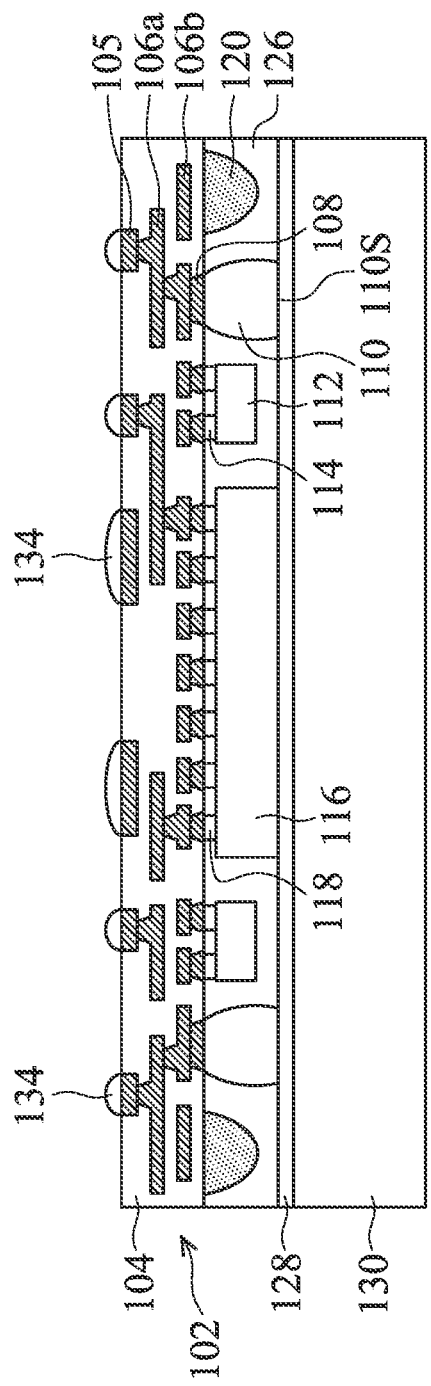
Figure 1L:
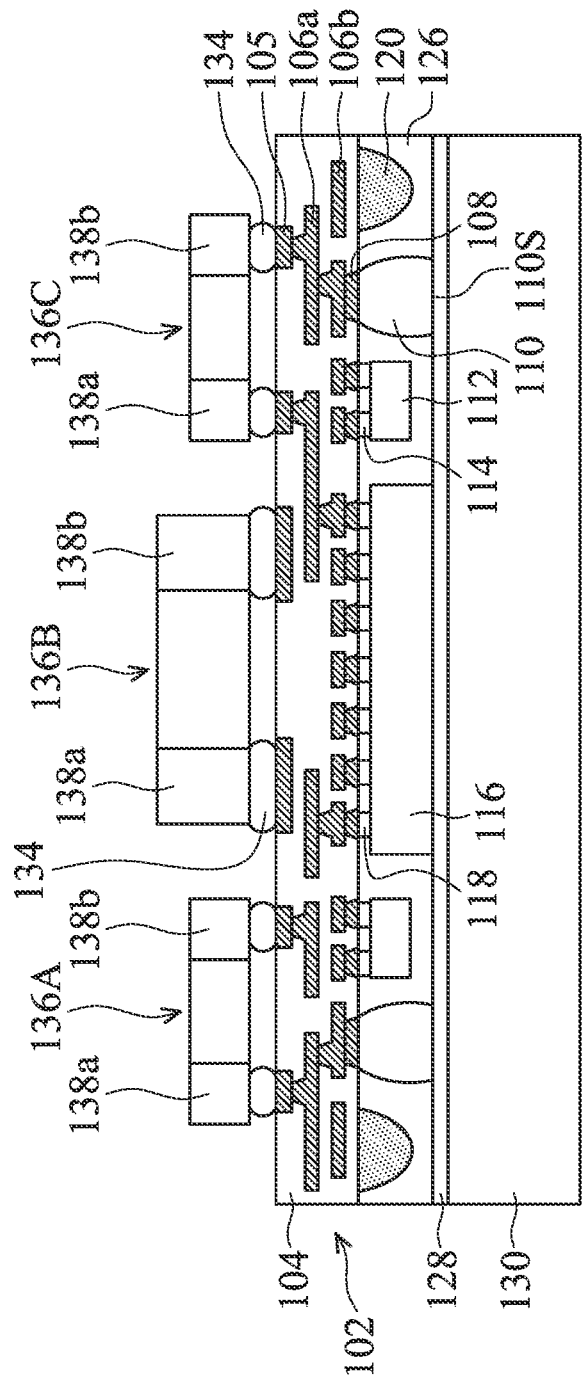
Figure 1M:
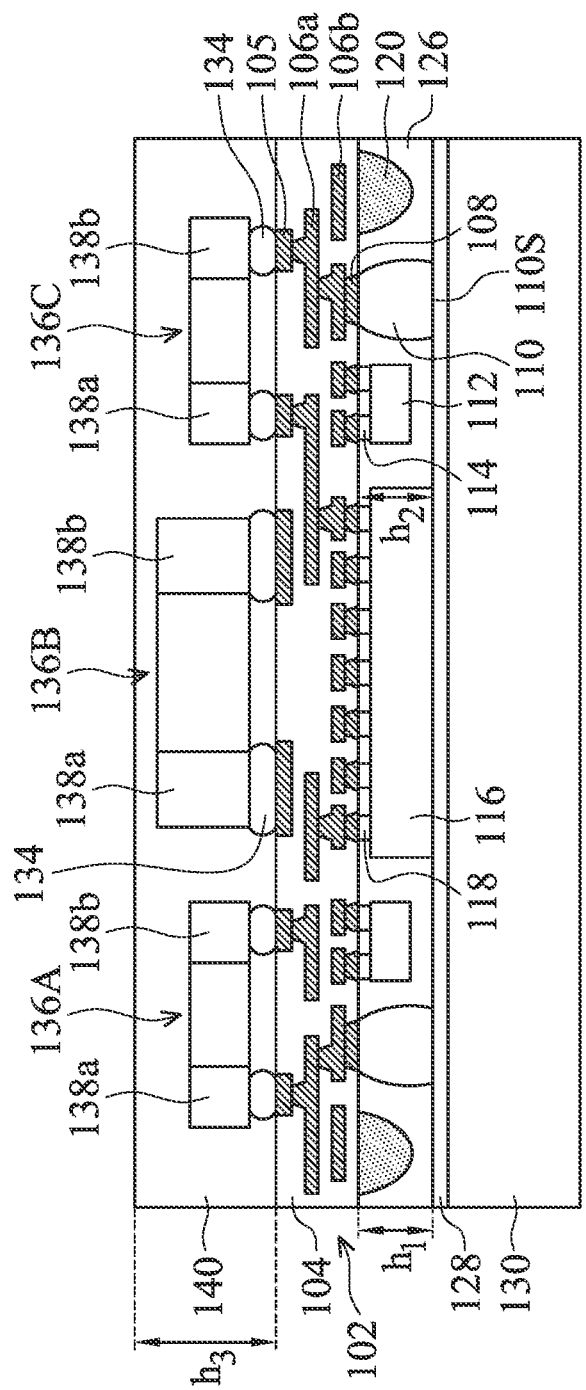
Figure 1N:
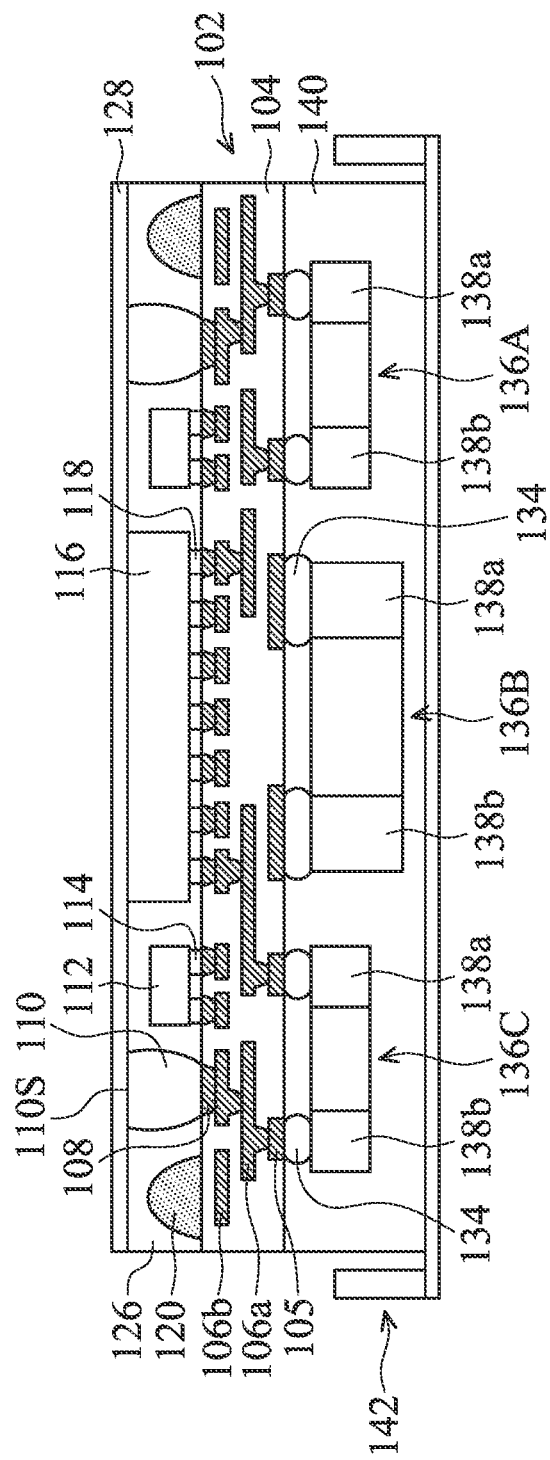
Figure 1P:
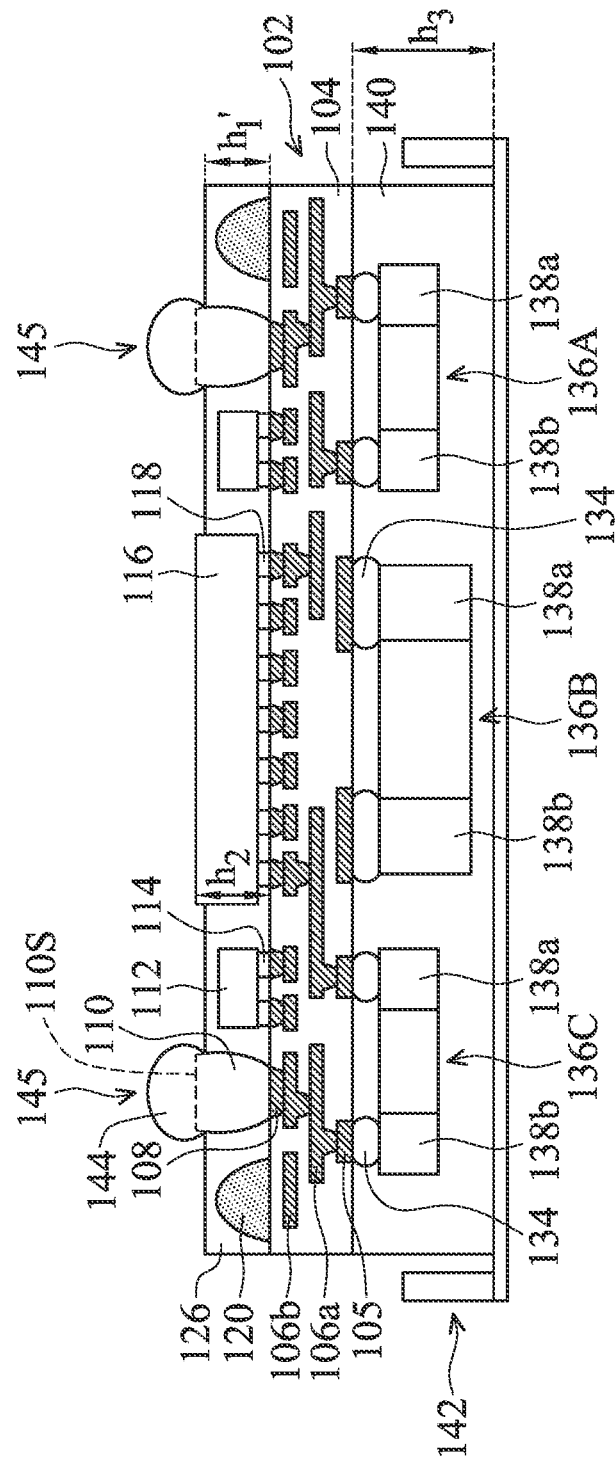
Figure 1Q:
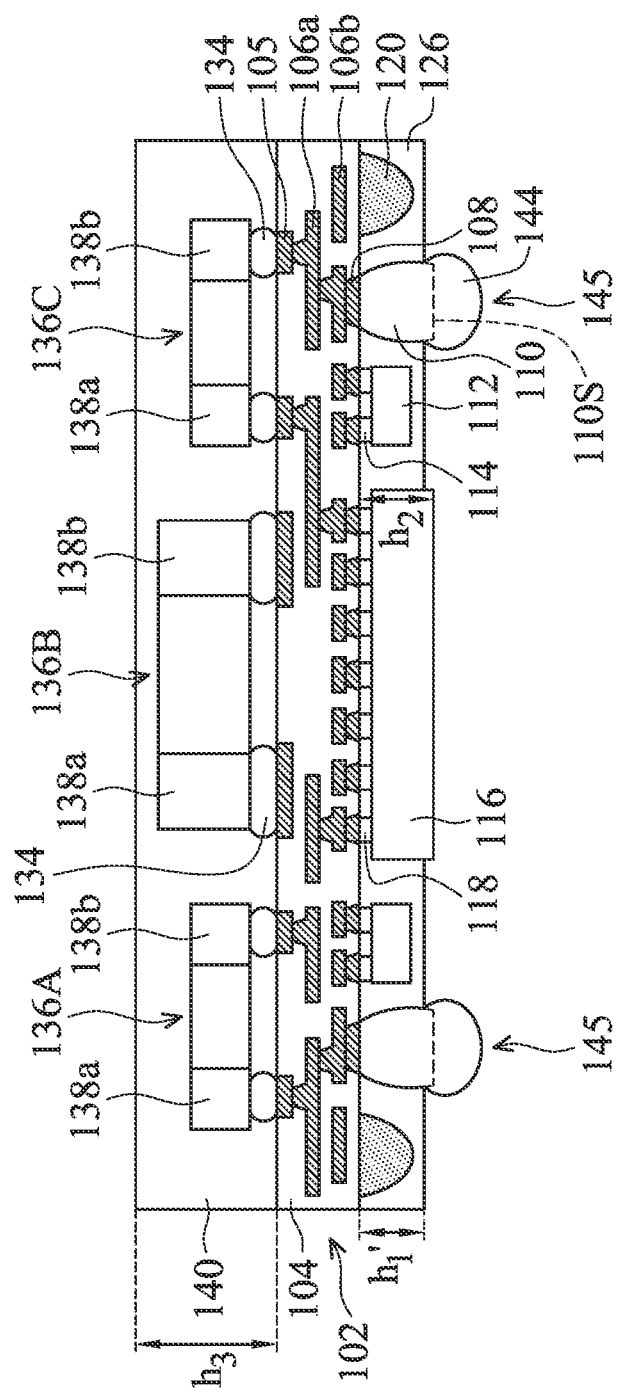
Figure 1R:
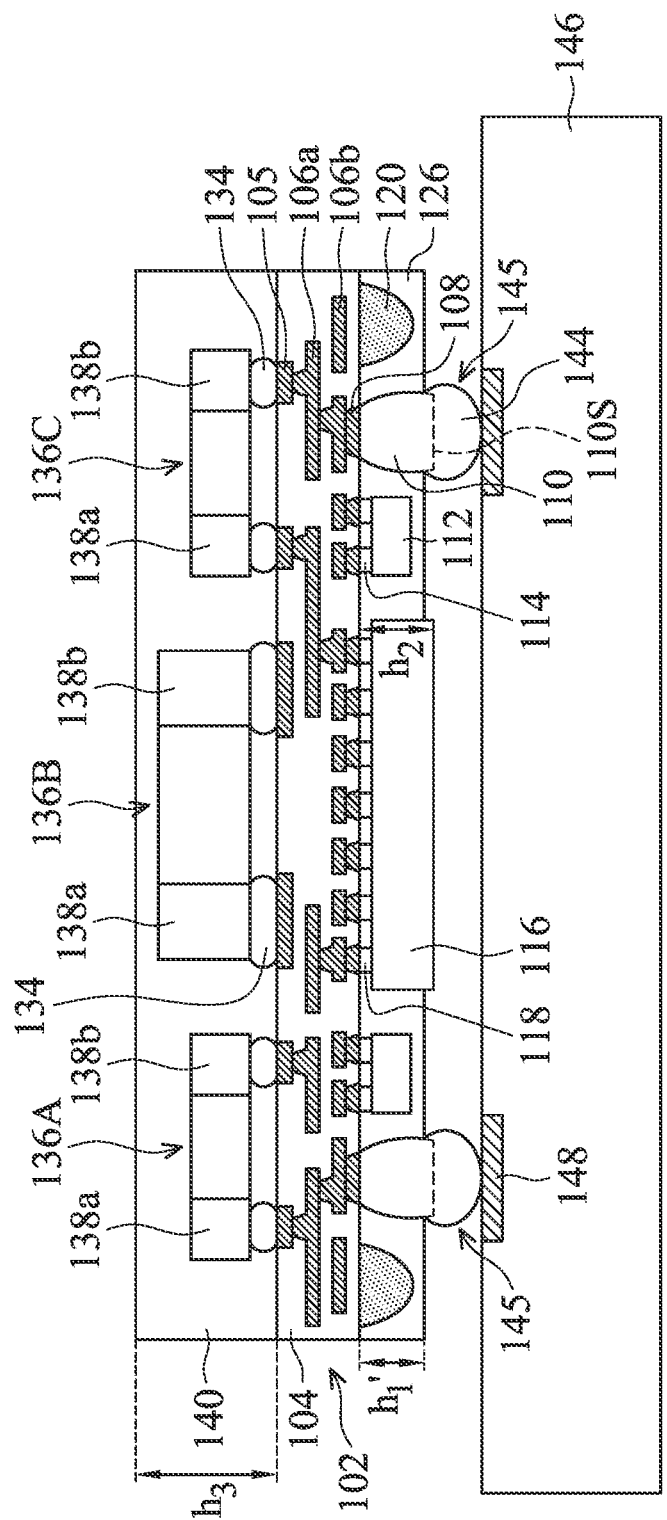

FIGS. 1A-1R are cross-sectional views of various stages of a process for forming a package structure, in accordance with some embodiments. As shown in FIG. 1A, a redistribution structure 102 is formed over a carrier substrate 100, in accordance with some embodiments. The carrier substrate 100 may be a glass substrate, a semiconductor substrate, or another suitable substrate.

In some embodiments, an adhesive tape 101 is formed over the carrier substrate 100 before the formation of the redistribution structure 102. In some embodiments, the adhesive tape 101 is sensitive to an energy beam irradiation. In some embodiments, the adhesive tape 101 a release layer that is made of or includes a light-to-heat conversion (LTHC) material. For example, a laser beam may be used to irradiate the adhesive tape 101. The irradiation may allow the redistribution structure 102 to be separated from the carrier substrate 100.

The redistribution structure 102 is used for routing, which enables the formation of a package structure with fan-out features. In some embodiments, the redistribution structure 102 includes multiple insulating layers 104 and multiple conductive features such as conductive features 105, 106a, and 106b. The conductive features 105, 106a, and 106b are surrounded by the insulating layers 104. The conductive features 105, 106a, and 106b may include conductive lines, conductive vias, and/or conductive pads.

The redistribution structure 102 also includes conductive features 108 that are used to hold or receive other elements. In some embodiments, the conductive features 108 are exposed at or protrude from the topmost surface of the insulating layers 104. The conductive features 108 may be used to hold or receive one or more semiconductor dies and/or one or more passive elements. The conductive features 108 may also be used to hold or receive conductive features such as conductive pillars and/or conductive bumps.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 105, 106a, 106b, and 108 may include conductive lines providing electrical connection in horizontal directions and conductive vias providing electrical connection in vertical directions. In some embodiments, some of the conductive vias are stacked with each other. The upper conductive via is substantially aligned with the lower conductive via. In some embodiments, some of the conductive vias are staggered vias. The upper conductive via is misaligned with the lower conductive via.

The conductive features 105, 106a, 106b, and 108 may be made of or include copper, aluminum, gold, cobalt, titanium, nickel, silver, graphene, one or more other suitable conductive materials, or a combination thereof. In some embodiments, the conductive features 105, 106a, 106b, and 108 include multiple sub-layers. For example, each of the conductive features 105, 106a, 106b, and 108 contains multiple sub-layers including Ti/Cu, Ti/Ni/Cu, Ti/Cu/Ti, Al/Ti/Ni/Ag, other suitable sub-layers, or a combination thereof.

The formation of the redistribution structure 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, a dry polishing process, one or more other applicable processes, or a combination thereof.

As shown in FIG. 1B, conductive bumps 110 and device elements 112 are formed or disposed over some of the conductive features 108, in accordance with some embodiments. In some embodiments, the conductive bumps 110 are tin-containing solder bumps. The tin-containing solder bumps may further include copper, silver, gold, aluminum, lead, one or more other suitable materials, or a combination thereof. In some other embodiments, the conductive bumps 110 are lead-free. In some embodiments, the conductive bumps 110 are tin-containing solder balls.

In some embodiments, the device elements 112 are bonded to the conductive features 108 through conductive structures 114. The conductive structures 114 may include solder bumps, conductive pillars, one or more other suitable bonding structures, or a combination thereof. The device elements 112 may include one or more passive elements such as resistors, capacitors, inductors, one or more other suitable elements, or a combination thereof. In some other embodiments, the device elements 112 include memory devices. In some embodiments, the device elements 112 include electrodes that are bonded to pad regions (i.e., some of the conductive features 108) of the redistribution structure 102 through the conductive structures 114.

In some embodiments, a flux material is dispensed onto the conductive features 108 before the formation or stacking of the conductive bumps 110 and the device elements 112. In some embodiments, a thermal reflow operation is then carried out to fix the conductive bumps 110 and the device elements 112 onto the redistribution structure 102.

As shown in FIG. 1C, a semiconductor die 116 is stacked over the redistribution structure 102, in accordance with some embodiments. The semiconductor die 116 may include application processors, power management integrated circuits, memory devices, one or more other suitable circuits, or a combination thereof. In some embodiments, each of the device elements 112 is thinner than the semiconductor die 116.

In some embodiments, the semiconductor die 116 is bonded onto some of the conductive features 108 through conductive features 118 of the semiconductor die 116. The conductive features 118 may include conductive pillars, solder elements, one or more other suitable bonding structures, or a combination thereof. For example, each of the conductive features 118 includes a combination of a metal pillar and a tin-containing solder element. In some embodiments, an underfill material is formed to surround and protect the conductive features 118 and the conductive structures 114. In some other embodiments, the underfill material is not formed.

As shown in FIG. 1D, a stiffener element 120 is formed over the redistribution structure 102, in accordance with some embodiments. The stiffener element 120 may be used to control and/or reduce warpage of the package structure during the subsequent formation processes. In some embodiments, the stiffener element 120 is a stiffener ring that surrounds the semiconductor die 116 and the conductive bumps 110.

Figure 9:
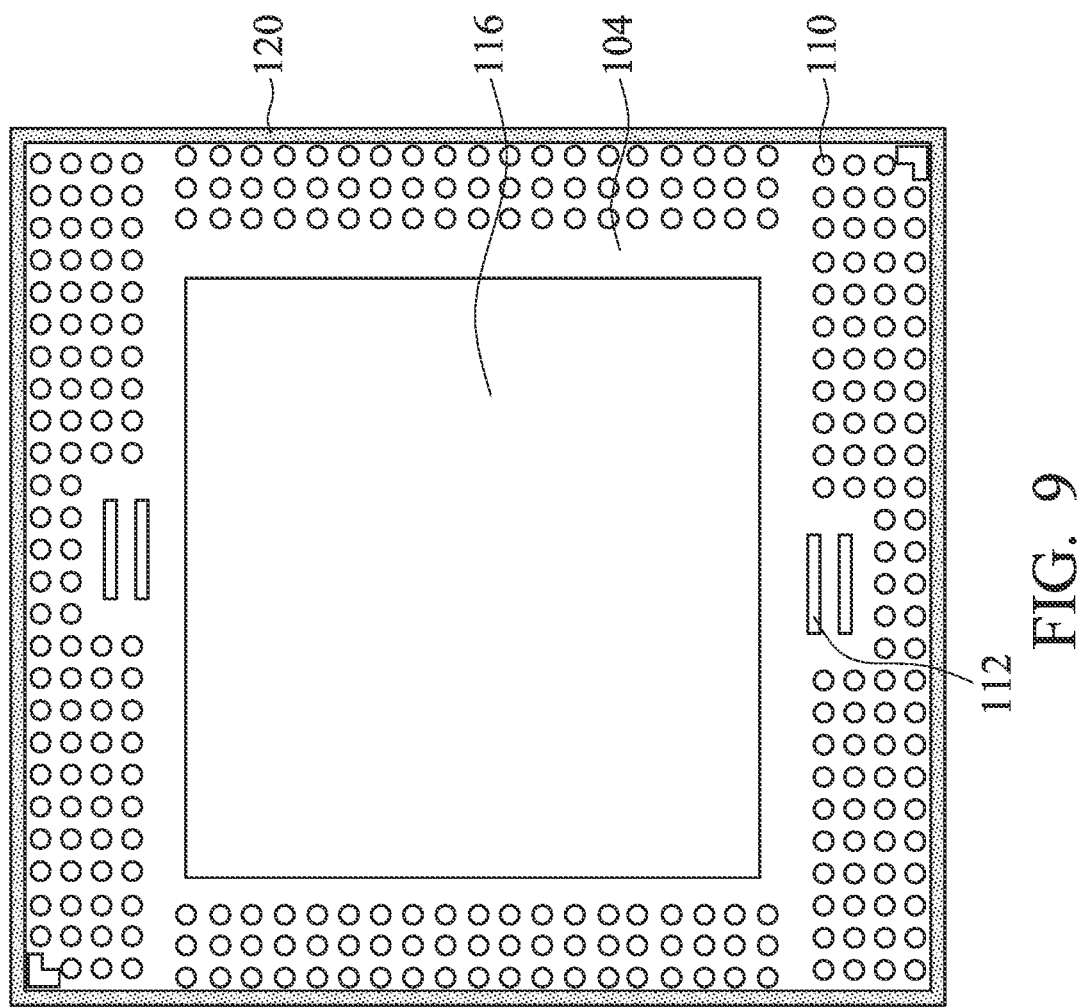
FIG. 9 is a top layout view of an intermediate stage of a process for forming a package structure, in accordance with some embodiments.
Figure 10:
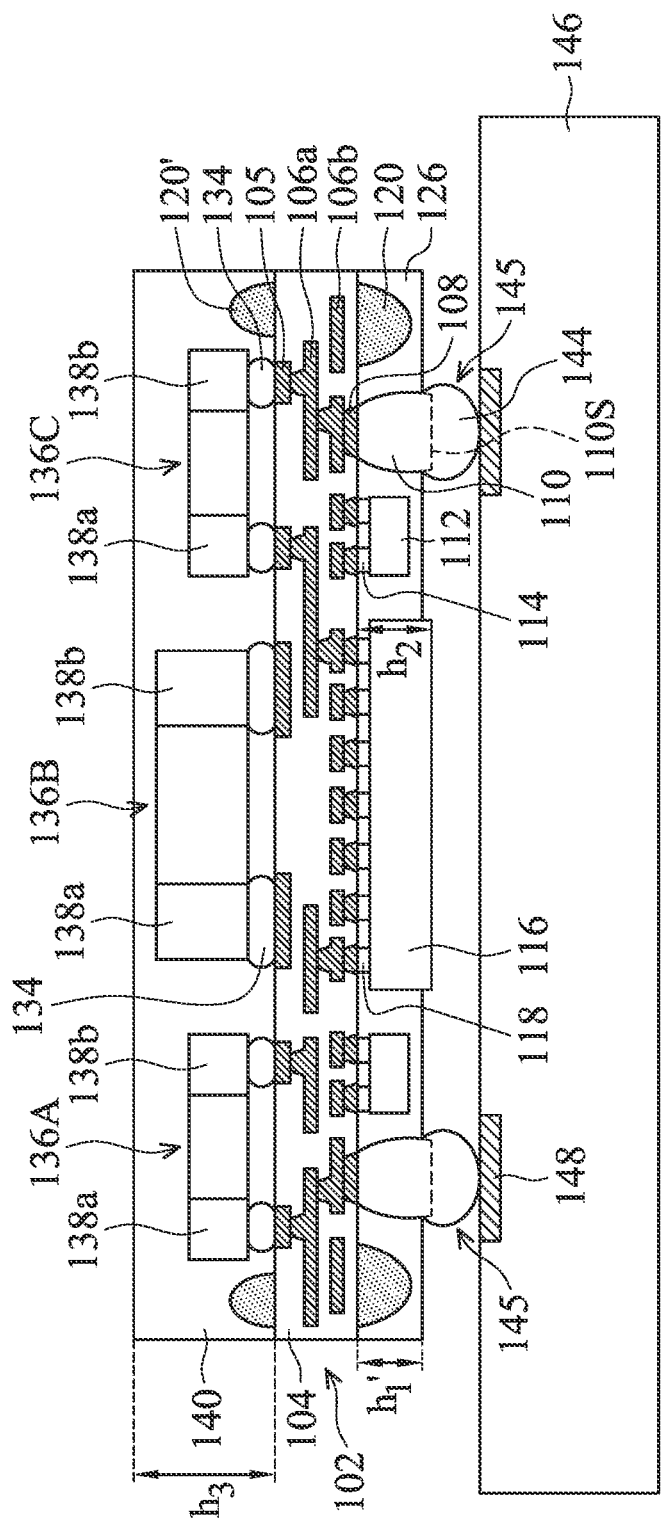

FIG. 9 is a top layout view of an intermediate stage of a process for forming a package structure, in accordance with some embodiments. In some embodiments, FIG. 9 shows the top layout view of the stiffener element 120 and other elements nearby. In some embodiments, the stiffener element 120 continuously surrounds the conductive bumps 110, the device elements 112, and the semiconductor die 116, as shown in FIG. 9.

The stiffener element 120 may be made of or include an insulating material (such as a polymer material), a semiconductor material, a metal material, one or more other suitable materials, or a combination thereof. In some embodiments, the stiffener element 120 is made of a polymer material such as an epoxy-based resin that is similar to a molding compound material or an underfill material. In these cases, the stiffener element 120 may be formed using a dispensing operation.

As shown in FIG. 1D, a provider 122 is used to dispense a polymer-containing material 124 onto the redistribution structure 102, in accordance with some embodiments. The provider 122 may move around the semiconductor die 116 and the conductive bumps 110 while the polymer-containing material 124 is dispensed. As a result, the dispensed polymer-containing material forms the stiffener element 120. In some embodiments, the stiffener element 120 is a stiffener ring that surrounds the semiconductor die 116 and the conductive bumps 110.

In some other embodiments, the stiffener element 120 is made of a semiconductor material such as silicon or a metal material such as aluminum. In some embodiments, the stiffener element 120 is a semiconductor frame or a metal frame. The semiconductor frame or the metal frame may be attached onto the redistribution structure 102 using a glue material.

As shown in FIG. 1E, a protective layer 126 is formed over the redistribution structure 102 to surround and protect the semiconductor die 116, in accordance with some embodiments. The protective layer 126 may further cover and protect the device elements 112, the conductive bumps 110, and the stiffener element 120.

In some embodiments, the protective layer 126 is made of or includes an insulating material such as a molding material. The molding material may include a polymer material, such as an epoxy-based resin with one or more fillers dispersed therein. The fillers may include insulating particles, insulating fibers, one or more other elements, or a combination thereof. For example, the fillers include silica particles, silica fibers, carbon-containing particles, carbon-containing fibers, or a combination thereof.

In some embodiments, a molding material (such as a liquid molding material) is introduced or injected onto the redistribution structure 102. In some embodiments, a thermal process is then used to cure the liquid molding material and to transform it into the protective layer 126.

As shown in FIG. 1F, the protective layer 126 is planarized to reduce the thickness of the protective layer 126, in accordance with some embodiments. In some embodiments, the protective layer 126 is planarized to expose the semiconductor die 116. In some embodiments, upper portions of the conductive bumps 110 are partially removed during the planarization of the protective layer 126. As a result, surfaces 110S of the conductive bumps 110 are formed, as shown in FIG. 1F. In some embodiments, the surfaces 110S are substantially planar surfaces. In some embodiments, the surfaces 110S are substantially level with the top surface of the protective layer 126. The planarization of the protective layer 126 may be achieved using a mechanical grinding process, a CMP process, a dry polishing process, one or more other applicable processes, or a combination thereof.

As shown in FIG. 1F, after the planarization process, the protective layer 126 has a thickness $h_1$, and the semiconductor die 116 has a thickness $h_2$. The thickness $h_1$ may be substantially equal to the thickness $h_2$.

As shown in FIG. 1G, a carrier substrate 130 is attached over the structure shown in FIG. 1F using an adhesive layer 128, in accordance with some embodiments. The carrier substrate 130 may be a glass substrate, a semiconductor substrate, or another suitable substrate. The adhesive layer 128 may be an adhesive tape that is made of a different material than the material of the adhesive tape 101.

As shown in FIG. 1H, the structure shown in FIG. 1G is turned upside down and irradiated with an energy beam 132, in accordance with some embodiments. The energy beam 132 may be a laser beam, an ultraviolet light, or another suitable energy beam. After the irradiation with the energy beam 132, the adhesive characteristics of the adhesive tape 101 may be destroyed or reduced. As mentioned above, the adhesive tape 101 and the adhesive layer 128 are made of different materials. For example, the adhesive layer 128 is made of an adhesive material other than the LTHC material. The adhesive layer 128 may maintain adhesive even if being irradiated with the energy beam 132.

As shown in FIG. 1I, the adhesive tape 101 and the carrier substrate 100 are removed to expose the redistribution structure 102, in accordance with some embodiments. Afterwards, the insulating layers 104 are partially removed to expose the conductive features 105, as shown in FIG. 1J in accordance with some embodiments. For example, the topmost layer of the insulating layers 104 is removed using a planarization process or an etching process.

As shown in FIG. 1K, solder elements 134 are formed on the conductive features 105, in accordance with some embodiments. The solder elements 134 may be made of or include a tin-containing solder material. For example, the solder elements 134 are solder paste. The tin-containing solder material may further include copper, silver, gold, aluminum, lead, one or more other suitable materials, or a combination thereof. In some other embodiments, the solder elements 134 are lead-free. The solder elements 134 may be formed using a printing process, a dispensing process, an application process, an electroplating process, an electroless plating process, one or more other applicable processes, or a combination thereof.

As shown in FIG. 1L, device elements 136A, 136B, and 136C are bonded to the conductive elements 105 through the solder elements 134, in accordance with some embodiments. In some embodiments, each of the device elements 136A, 136B, and 136C includes one or more passive elements such as resistors, capacitors, inductors, one or more other suitable elements, or a combination thereof. In some other embodiments, one or some of the device elements 136A, 136B, and 136C include memory devices. In some embodiments, each of the device elements 136A, 136B, and 136C includes electrodes 138a and 138b. In some embodiments, the electrodes 138a and 138b of the device elements 136A, 136B, and 136C are bonded to pad regions (such as the conductive features 105) of the redistribution structure 102 through the solder elements 134.

The device elements 136A, 136B, and 136C may have different thicknesses. In some embodiments, the device element 136A, 136B, or 136C is thicker than the semiconductor die 116. In some embodiments, the semiconductor die 116 is wider than the device element 136A, 136B, or 136C.

As shown in FIG. 1M, a protective layer 140 is formed over the redistribution structure 102 to surround and cover the device elements 136A, 136B, and 136C, in accordance with some embodiments. In some embodiments, the protective layer 140 and the protective layer 126 are made of different materials. In some embodiments, the protective layer 140 is made of or includes an insulating material such as a molding material. The molding material may include a polymer material, such as an epoxy-based resin with one or more fillers dispersed therein. The fillers may include insulating particles, insulating fibers, one or more other elements, or a combination thereof. For example, the fillers include silica particles, silica fibers, carbon-containing particles, carbon-containing fibers, or a combination thereof.

In some embodiments, a molding material (such as a liquid molding material) is introduced or injected onto the redistribution structure 102. In some embodiments, a thermal process is then used to cure the liquid molding material and to transform it into the protective layer 140. A planarization process may then be used to provide the protective layer 140 with a substantially planar top surface.

As shown in FIG. 1M, the protective layer 140 has a thickness $h_3$. In some embodiments, the thickness $h_3$ is greater than the thickness $h_1$ of the protective layer 126. Since the semiconductor die 116 is thinner than the device element 136A, 136B, or 136C, the protective layer 126 that is thinner than the protective layer 140 is sufficient to surround and protect the semiconductor die 116. With the protective layer 126 that is thinner, the total thickness of the package structure is further reduced, which meets the demand of producing thinner and smaller package structure.

In some embodiments, the protective layers 126 and 140 have different coefficients of thermal expansion. In some embodiments, the protective layer 126 has a greater coefficient of thermal expansion than that of the protective layer 140. The thinner protective layer 126 with the greater coefficient of thermal expansion may compensate the expansion of the thicker protective layer 140 with the lower coefficient of thermal expansion. The warpage of the package structure that occurs during or after the fabrication processes may therefore be reduced. The quality and reliability of the package structure are improved.

Below the glass transition temperature (Tg) of the protective layer 126, the protective layer 126 may have a first coefficient of thermal expansion (CTE1). Above the glass transition temperature (Tg) of the protective layer 126, the protective layer 126 may have a second coefficient of thermal expansion (CTE2). Similarly, the protective layer 140 may also have a first coefficient of thermal expansion (CTE1') and a second coefficient of thermal expansion (CTE2') at the temperature range below and above the glass transition temperature (Tg) of the protective layer 140, respectively.

In some embodiments, the ratio (CTE1'/CTE1) of the first coefficient of thermal expansion (CTE1') of the protective layer 140 to the first coefficient of thermal expansion (CTE1) of the protective layer 126 is in a range from about 0.8 to about 0.95. In some embodiments, the ratio (CTE2'/CTE2) of the second coefficient of thermal expansion (CTE2') of the protective layer 140 to the second coefficient of thermal expansion (CTE2) of the protective layer 126 is in a range from about 0.1 to about 0.7.

As mentioned above, each of the protective layer 126 and the protective layer 140 may include fillers dispersed in a polymer-based material. In some embodiments, the weight percentage of fillers in the protective layer 140 is greater than the weight percentage of fillers in the protective layer 126. In some embodiments, by adjusting the amount, the size of the fillers, and/or the material of the fillers in the protective layers 126 and 140, the corresponding coefficients of thermal expansion may be fine-tuned. The chain length, the functional groups, and/or the average molecular weight of the polymer-based material may also be modified to fine-tune the corresponding coefficients of thermal expansion.

As shown in FIG. 1N, the structure shown in FIG. 1M is turned upside down and attached onto a frame carrier 142, in accordance with some embodiments. Afterwards, the carrier substrate 130 is removed to expose the adhesive layer 128.

As shown in FIG. 1O, the adhesive layer 128 is removed to expose the surfaces 110S of the conductive bumps 110 and the protective layer 126, in accordance with some embodiments. An etching back process may be used to remove the adhesive layer 128. The etchant used in the etching back process may also etch the protective layer 126 to reduce the thickness of the protective layer 126. As a result, portions of the conductive bumps 110 protrude from the top surface of the protective layer 126. In some embodiments, a portion of the semiconductor die 116 also protrudes from the top surface of the protective layer 126. In some embodiments, the etching back process is a dry etching process.

As shown in FIG. 1O, the protective layer 126 is slightly thinned to a thickness of $h_1'$. The thickness $h_2$ of the semiconductor die 116 is thicker than the thickness $h_1'$. The ratio ($h_1'/h_2$) of the thickness $h_1'$ to the thickness $h_2$ may be in a range from about 0.8 to about 0.95.

However, embodiments of the disclosure are not limited thereto. Many variations and/or modifications can be made to embodiments of the disclosure. In some other embodiments, the etching back process for removing the adhesive layer 128 is a wet etching process. In some embodiments, the protective layer 126 is substantially not etched back by the wet etching process. In these cases, the semiconductor die 116 may be substantially as thick as the protective layer 126. In some embodiments, the top surfaces of the semiconductor die 116, the protective layer 126, and the conductive bumps 110 are substantially level with each other.

As shown in FIG. 1P, solder elements 144 are formed over the conductive bumps 110 that are exposed after the removal of the carrier substrate 130 and the adhesive layer 128, in accordance with some embodiments. In some embodiments, the solder elements 144 are formed directly on the surfaces 110S of the conductive bumps 110.

The solder elements 144 may be made of a tin-containing solder material. The tin-containing solder material may further include copper, silver, gold, aluminum, lead, one or more other suitable materials, or a combination thereof. In some other embodiments, the solder elements 144 are lead-free. In some embodiments, a thermal reflow process is used to reflow the solder elements 144 and the conductive bumps 110 thereunder. As a result, the conductive bumps 145 are formed.

In some embodiments, each of the conductive bumps 145 has a lower portion that is surrounded by the protective layer 126, as shown in FIG. 1P. Each of the conductive bumps 145 has an upper portion that protrudes from the top surface of the protective layer 126. In some embodiments, the sidewall surface of the upper portion of the conductive bump 145 curves outwards. In some embodiments, the upper portion of the conductive bump 145 extends across opposite edges of the interface between the upper portion and the lower portion of the conductive bump 145. In some embodiments, the conductive bump 145 has a gourd-like profile, as shown in FIG. 1P.

Afterwards, a sawing operation is used to cut the structure shown in FIG. 1P into multiple package structures that are separated from each other. FIG. 1Q shows the cross-sectional view of one of the obtained package structures that is taken away from the frame carrier 142.

As shown in FIG. 1R, the package structure is bonded onto a board 146, in accordance with some embodiments. A thermal reflow process may be used to form bonding between the conductive bumps 145 and conductive pads 148 of the board 146. The board 146 may be a printed circuit board, an interposer board, or another suitable substrate.

Figure 2A:
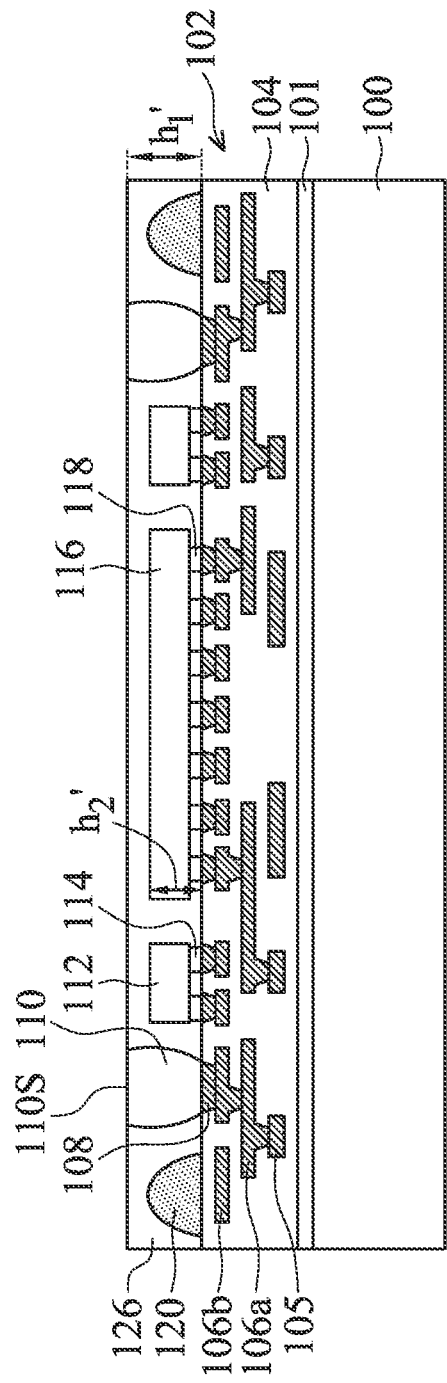
FIGS. 2A-2B are cross-sectional views of various stages of a process for forming a package structure, in accordance with some embodiments.
Figure 2B:
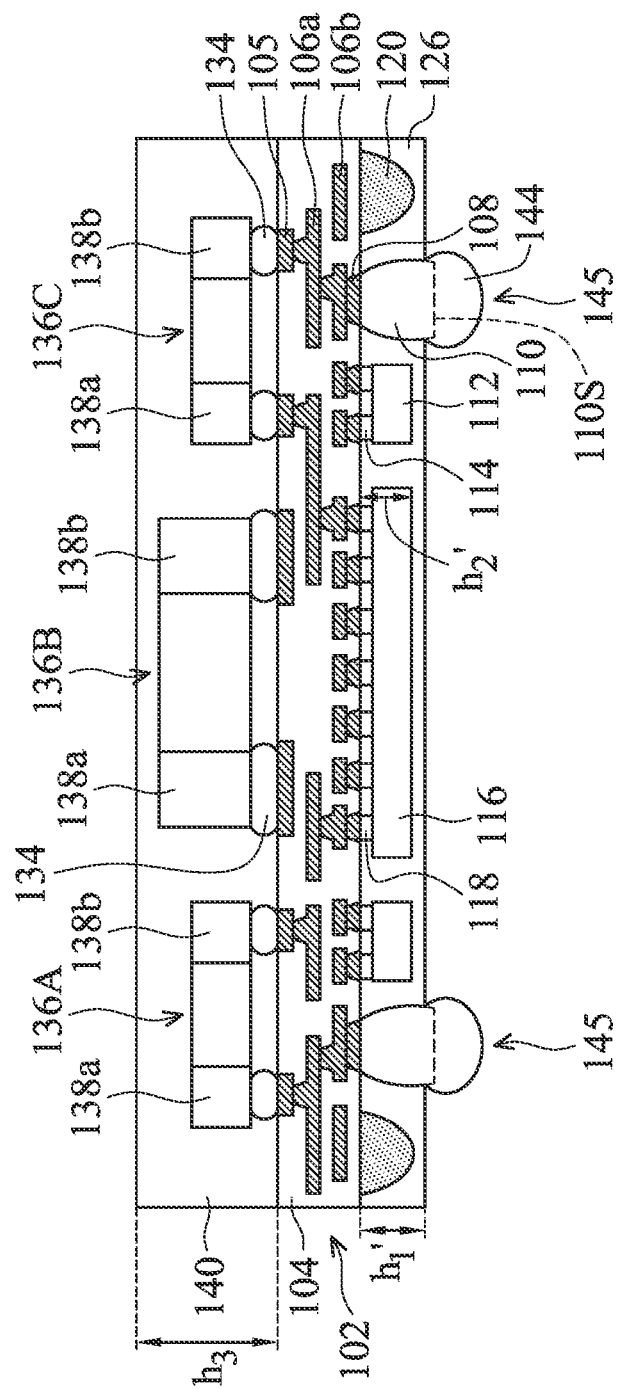

Many variations and/or modifications can be made to embodiments of the disclosure. FIGS. 2A-2B are cross-sectional views of various stages of a process for forming a package structure, in accordance with some embodiments. As shown in FIG. 2A, similar to the embodiments illustrated in FIG. 1F, the protective layer 126 is planarized. The planarization process reduces the thickness of the protective layer 126 to be the thickness $h_1$. The planarization process also partially removes the conductive bumps 110. However, a portion of the protective layer 126 remains over the semiconductor die 116. In these cases, the semiconductor die 116 that has a thickness $h_2'$ is covered by the protective layer 126 without being exposed.

Afterwards, process steps similar to the embodiments illustrated in FIGS. 1G-1Q are performed to form the package structure shown in FIG. 2B, in accordance with some embodiments.

Figure 3A:
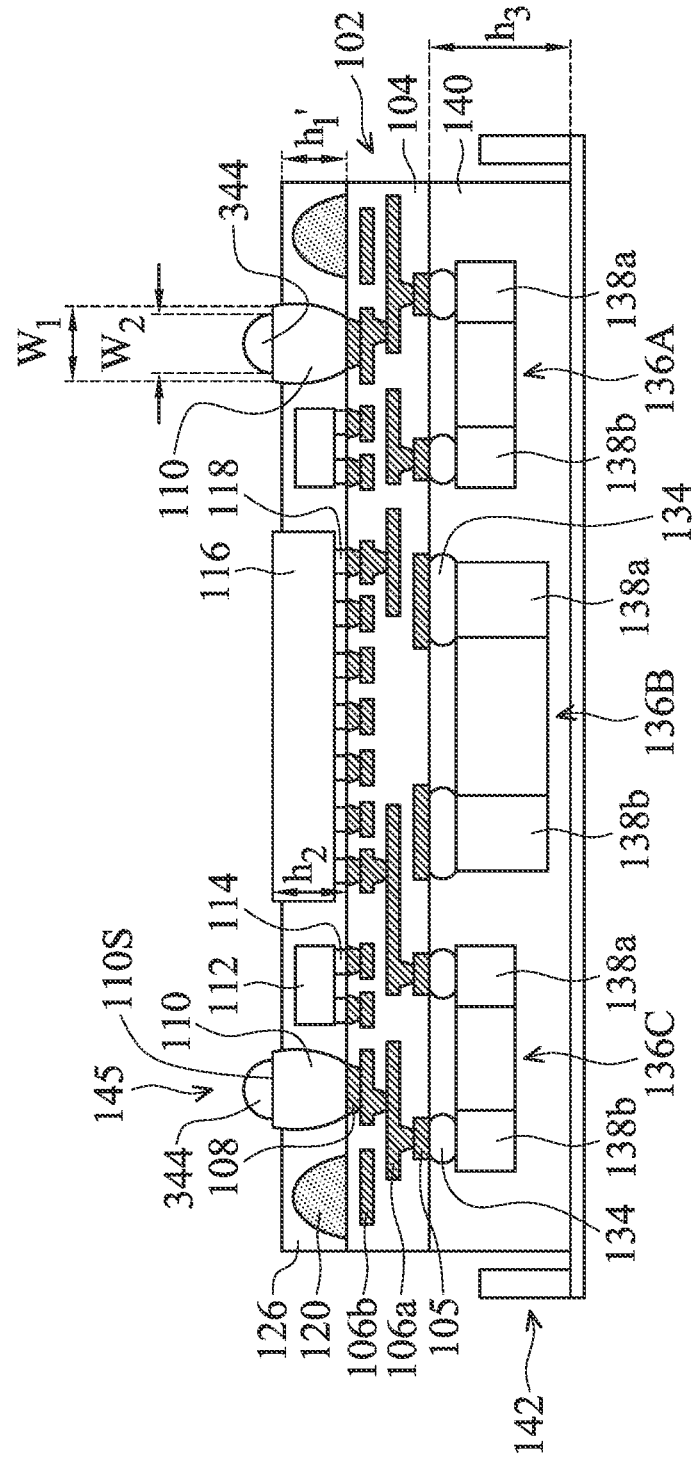
FIGS. 3A-3B are cross-sectional views of various stages of a process for forming a package structure, in accordance with some embodiments.
Figure 3B:
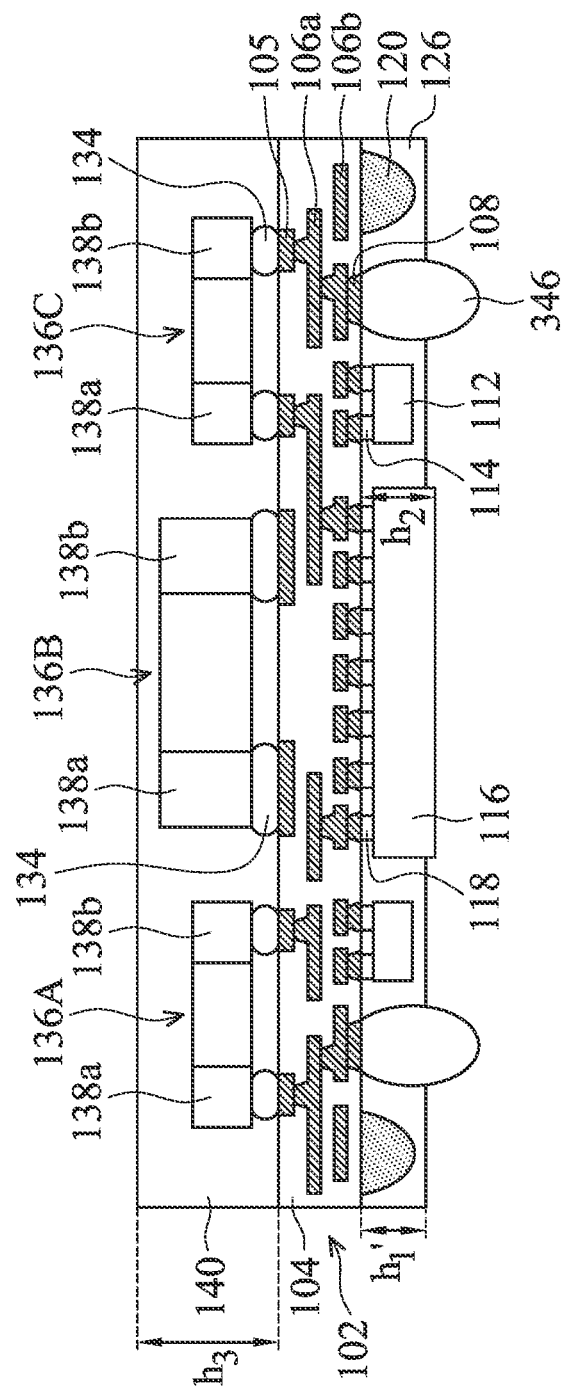

Many variations and/or modifications can be made to embodiments of the disclosure. FIGS. 3A-3B are cross-sectional views of various stages of a process for forming a package structure, in accordance with some embodiments.

As shown in FIG. 3A, a structure similar to that shown in FIG. 1O is received or formed. Afterwards, solder elements 344 are dispensed or disposed on the surfaces 110S of the conductive bumps 110, in accordance with some embodiments. The material of the solder elements 344 may be the same as or similar to that of the solder elements 144. Each of the solder elements 344 may have a small volume. As shown in FIG. 3A, the solder element 344 has a width $W_2$, and the surface 110S of the conductive bump 110 has a width $W_1$. In some embodiments, the width $W_1$ is wider than the width $W_2$. In some embodiments, the solder elements 344 are tin-containing solder paste. By controlling the dispensed amount of the solder paste, the sizes of the solder elements 344 may be fine-tuned accordingly.

Afterwards, a thermal reflow process is used to reflow the solder elements 344 and the conductive bumps 110, in accordance with some embodiments. As a result, conductive bumps 346 are formed. In these cases, one of the conductive bumps 346 has a ball-like profile. Afterwards, similar to the embodiments illustrated in FIG. 1Q, a sawing operation is used to form multiple package structures that are separated from each other. FIG. 3B shows the cross-sectional view of one of the package structures taken away from the frame carrier 142.

Figure 4:
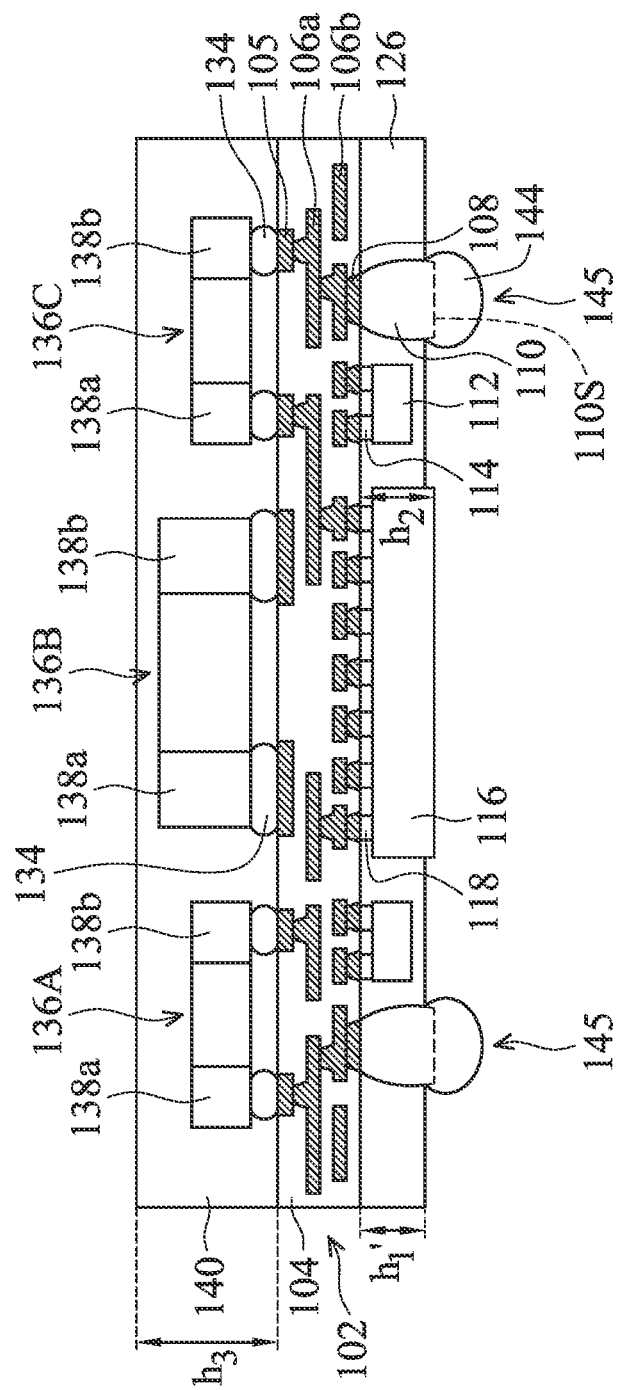
FIG. 4 is a cross-sectional view of a package structure, in accordance with some embodiments.

In some embodiments, the stiffener elements 120 are used to further reduce or control the warpage of the package structure during or after the fabrication processes. However, embodiments of the disclosure are not limited thereto. Many variations and/or modifications can be made to embodiments of the disclosure. FIG. 4 is a cross-sectional view of a package structure, in accordance with some embodiments. In some embodiments, the stiffener elements 120 are not formed.

Many variations and/or modifications can be made to embodiments of the disclosure. FIGS. 5A-5E are cross-sectional views of various stages of a process for forming a package structure, in accordance with some embodiments.

Figure 5A:
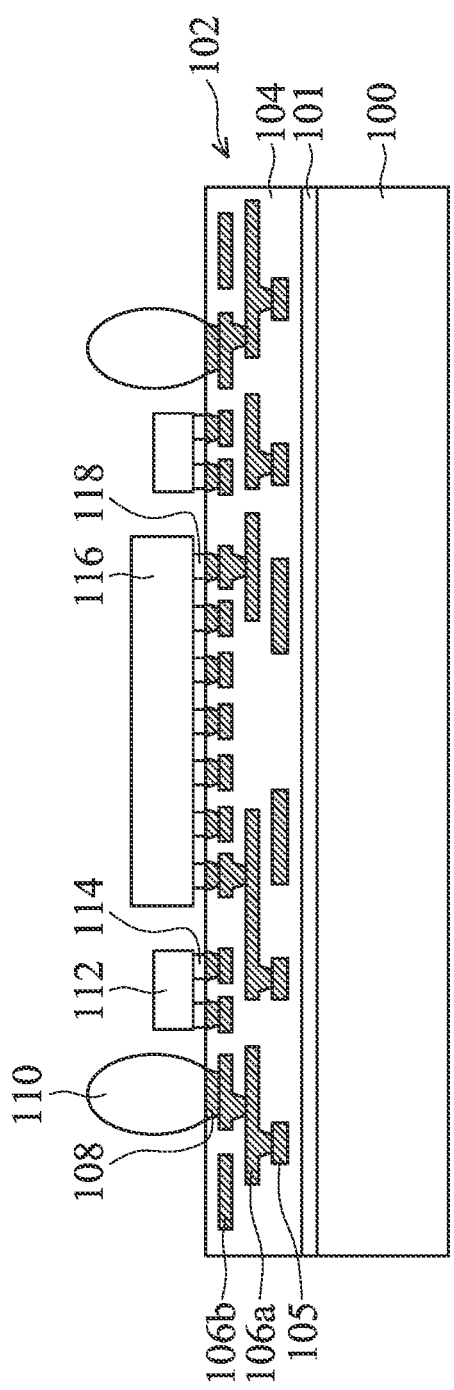
Figure 5B:
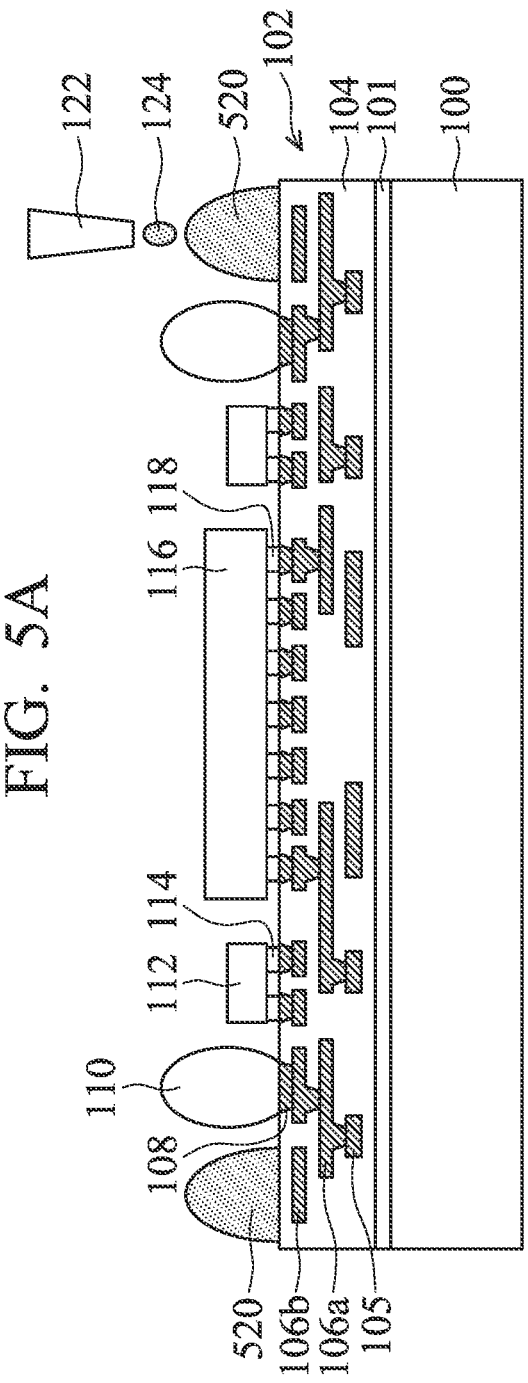

As shown in FIG. 5A, a structure similar to that shown in FIG. 1C is received or formed. Afterwards, similar to the embodiments illustrated in FIG. 1D, a stiffener element 520 is formed, as shown in FIG. 5B in accordance with some embodiments. In some embodiments, unlike the stiffener element 120, the stiffener element 520 is formed to have a greater height. For example, the top of the stiffener element 520 is positioned at a height level that is higher than the top surface of the device element 112. In some embodiments, the stiffener element 520 surrounds the semiconductor die 116, the conductive bumps 110, and the device elements 112.

As shown in FIG. 5C, similar to the embodiments illustrated in FIG. 1E, the protective layer 126 is formed to cover the semiconductor die 116, the conductive bumps 110, and the stiffener element 520, in accordance with some embodiments.

Afterwards, similar to the embodiments illustrated in FIG. 1F, the protective layer 126 is planarized, as shown in FIG. 5D in accordance with some embodiments. During the planarization process, the conductive bumps 110 are partially removed to form the surfaces 110S. The stiffener element 520 is also partially removed to form a surface 520S. In some embodiments, the surface 520S is substantially planar. In some embodiments, the surface 520S is substantially level with the surfaces 110S of the conductive bumps 110 and/or the top surface of the protective layer 126.

Figure 5E:
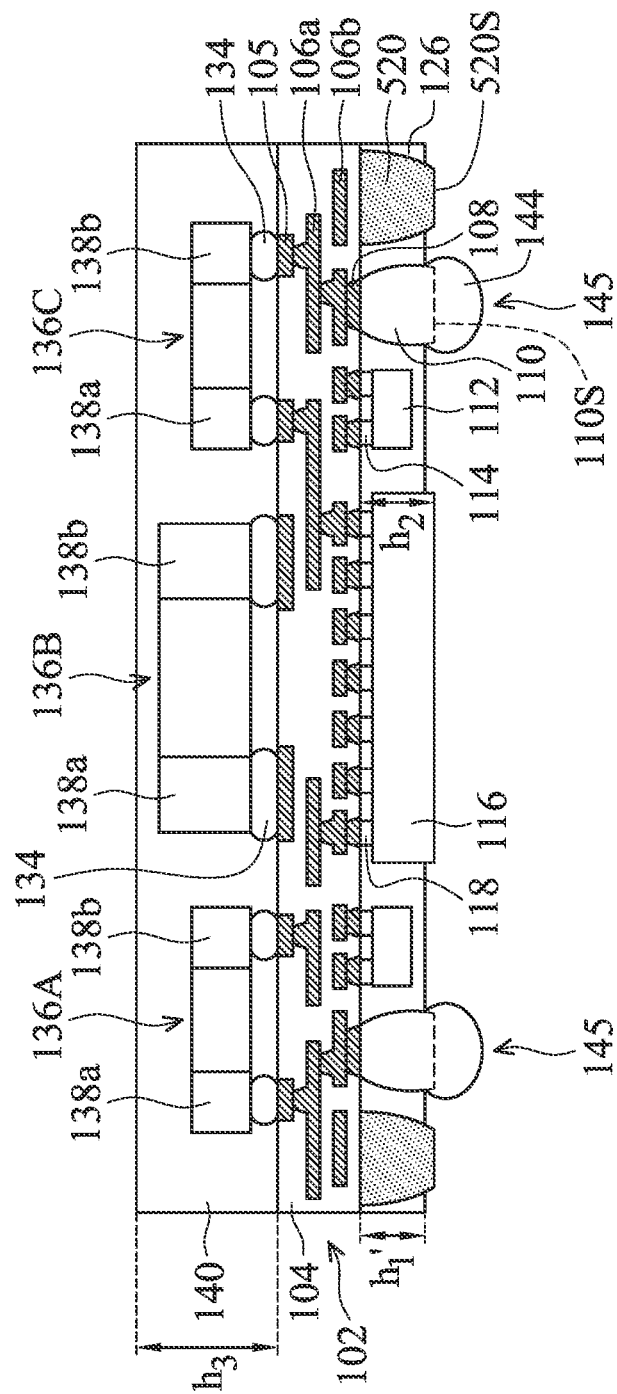

Afterwards, steps of the process that are similar to those illustrated in FIGS. 1G-1Q are performed, in accordance with some embodiments. As a result, a package structure is obtained, as shown in FIG. 5E.

Figure 6:
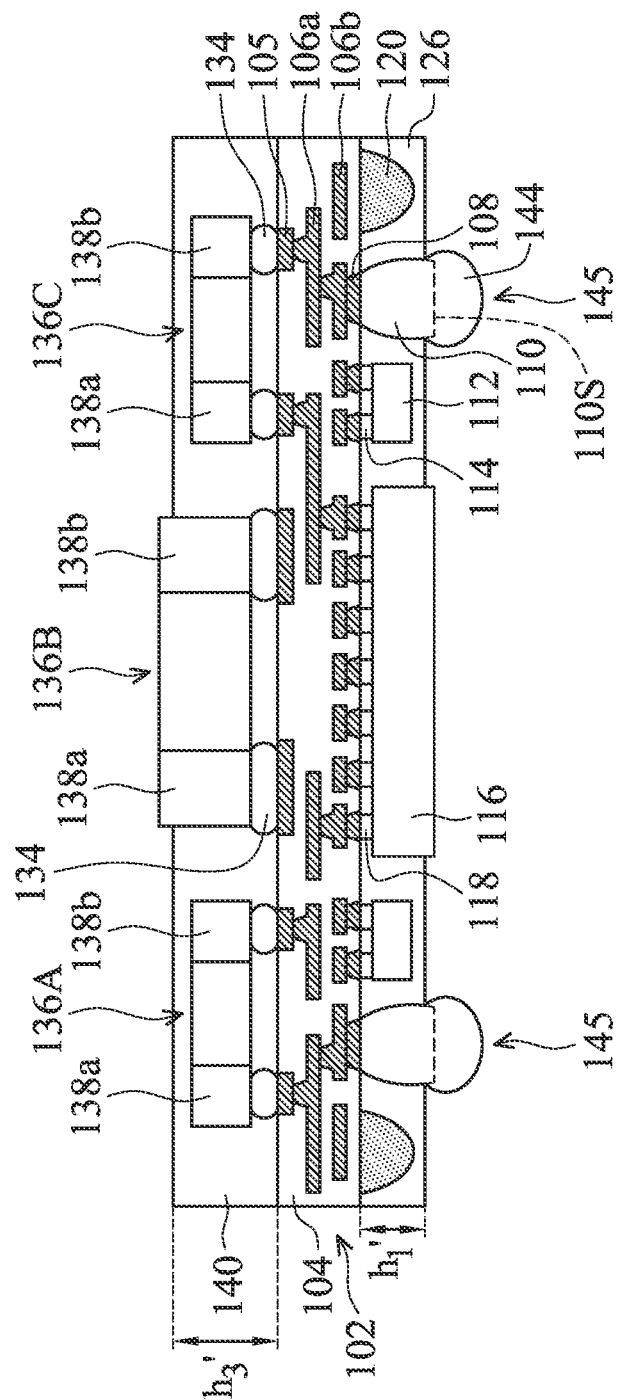
FIG. 6 is a cross-sectional view of a package structure, in accordance with some embodiments.

Many variations and/or modifications can be made to embodiments of the disclosure. FIG. 6 is a cross-sectional view of a package structure, in accordance with some embodiments. In some embodiments, the protective layer 140 is formed to have a thickness $h_3'$. The thickness $h_3'$ is greater than the thickness $h_1'$ of the protective layer 126. In some embodiments, the protective layer 140 is formed to be thinner than one (or some) of the device elements 136A, 136B, and 136C. For example, the device element 136B is thicker than the protective layer 140. The device element 136B protrudes from the top surface of the protective layer 140, as shown in FIG. 6.

Many variations and/or modifications can be made to embodiments of the disclosure. FIGS. 7A-7L are cross-sectional views of various stages of a process for forming a package structure, in accordance with some embodiments.

As shown in FIG. 7A, a redistribution structure 702 is formed over an adhesive tape 701 attached on a carrier substrate 700, in accordance with some embodiments. Similar to the redistribution structure 102 illustrated in FIG. 1A, the redistribution structure 702 includes multiple insulating layers 704 and multiple conductive features 706a, 706b, and 708. The material and formation method of the redistribution structure 702 may be the same as or similar to those of the redistribution structure 102.

As shown in FIG. 7B, solder elements 710 are formed over the conductive features 708 that are exposed, in accordance with some embodiments. The material and formation method of the solder elements 710 may be the same as or similar to those of the solder elements 134 illustrated in FIG. 1K.

Figure 7C:
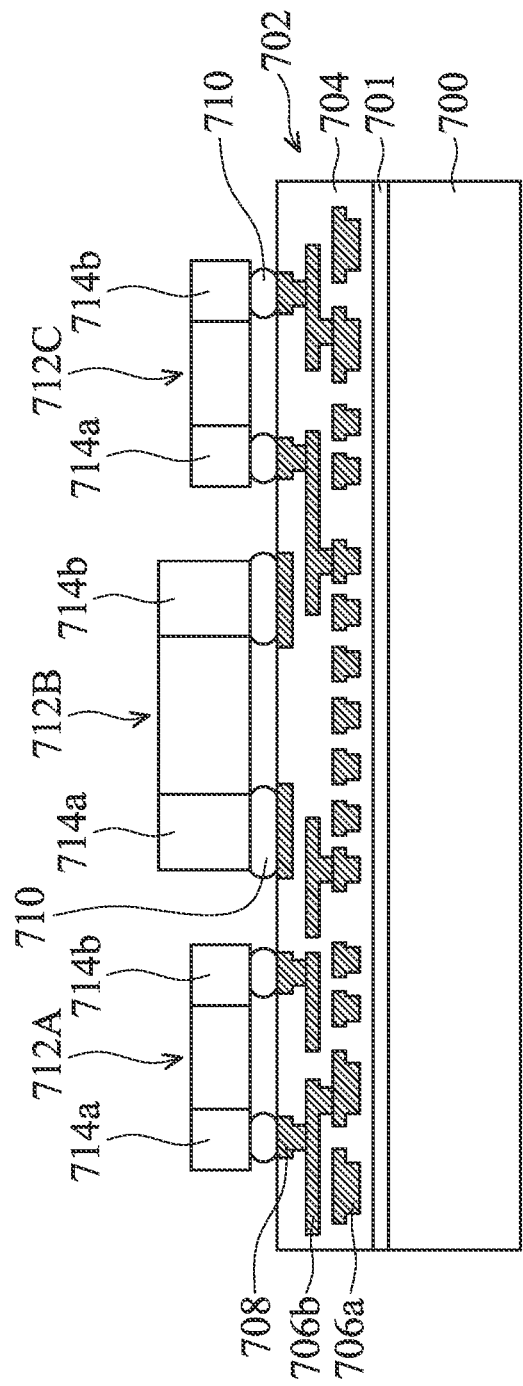

As shown in FIG. 7C, similar to the embodiments illustrated in FIG. 1L, device elements 712A, 712B, and 712C are stacked over the redistribution structure 702, in accordance with some embodiments. The device elements 712A, 712B, and 712C may be similar to the device elements 136A, 136B, and 136C. Each of the device elements 712A, 712B, and 712C has electrodes 714a and 714b. The device elements 712A, 712B, and 712C may be bonded to the conductive features 708 through the solder elements 710.

Figure 7D:
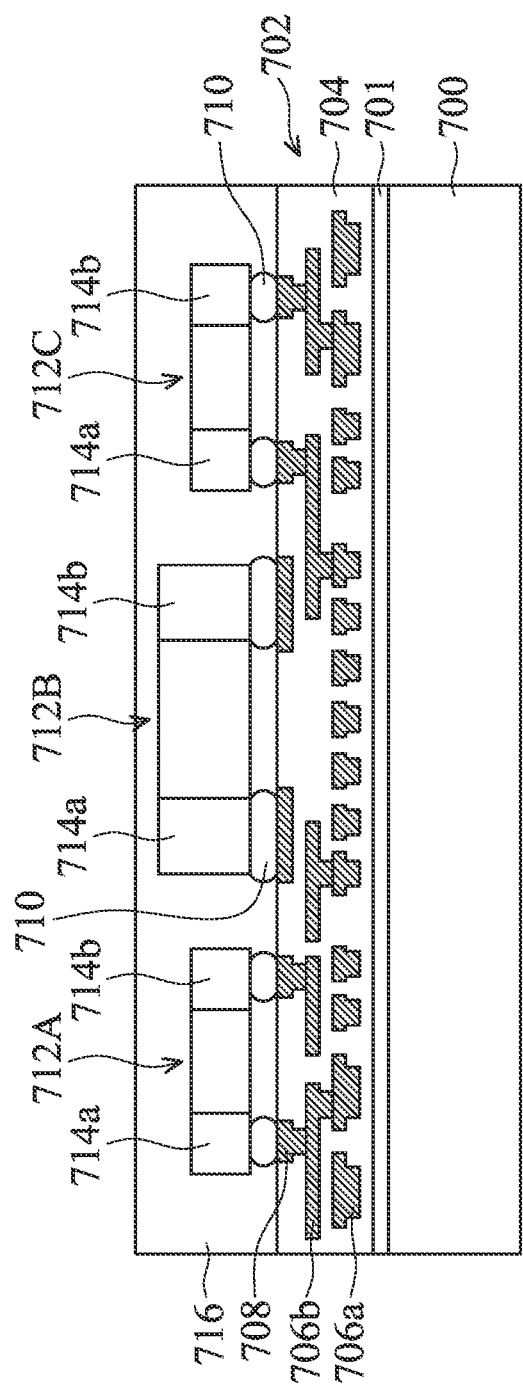

As shown in FIG. 7D, similar to the embodiments illustrated in FIG. 1M, a protective layer 716 is formed, in accordance with some embodiments. The material and formation method of the protective layer 716 may be the same as or similar to those of the protective layer 140 illustrated in FIG. 1M.

Figure 7E:
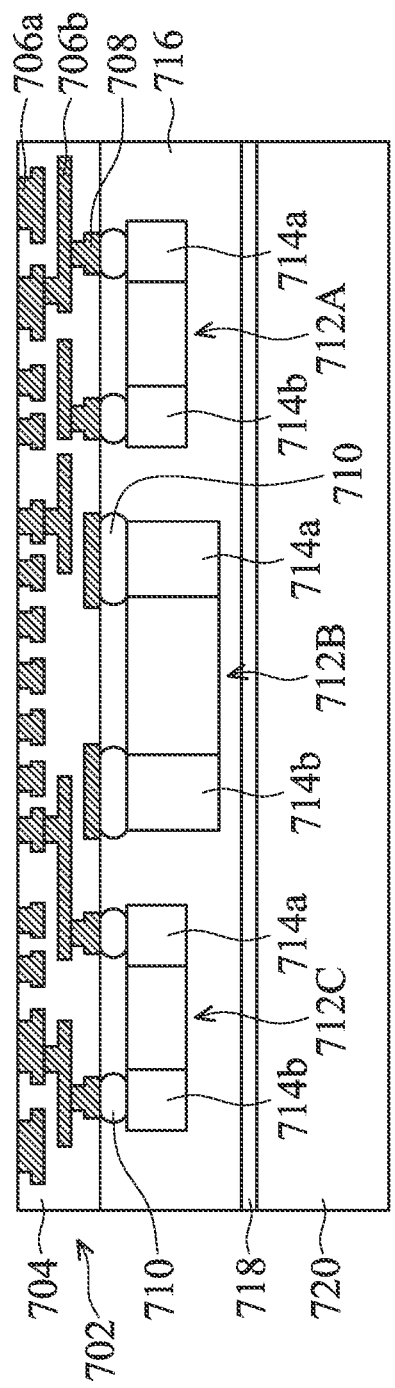

As shown in FIG. 7E, the structure shown in FIG. 7D is turned upside down and attached onto a carrier substrate 720 through an adhesive layer 718, in accordance with some embodiments. Afterwards, the carrier substrate 700 and the adhesive tape 701 are removed to expose the redistribution structure 702. Then, similar to the embodiments illustrated in FIG. 1J, the insulating layers 704 are partially removed to expose the conductive features 706a, as shown in FIG. 7E.

Figure 7F:
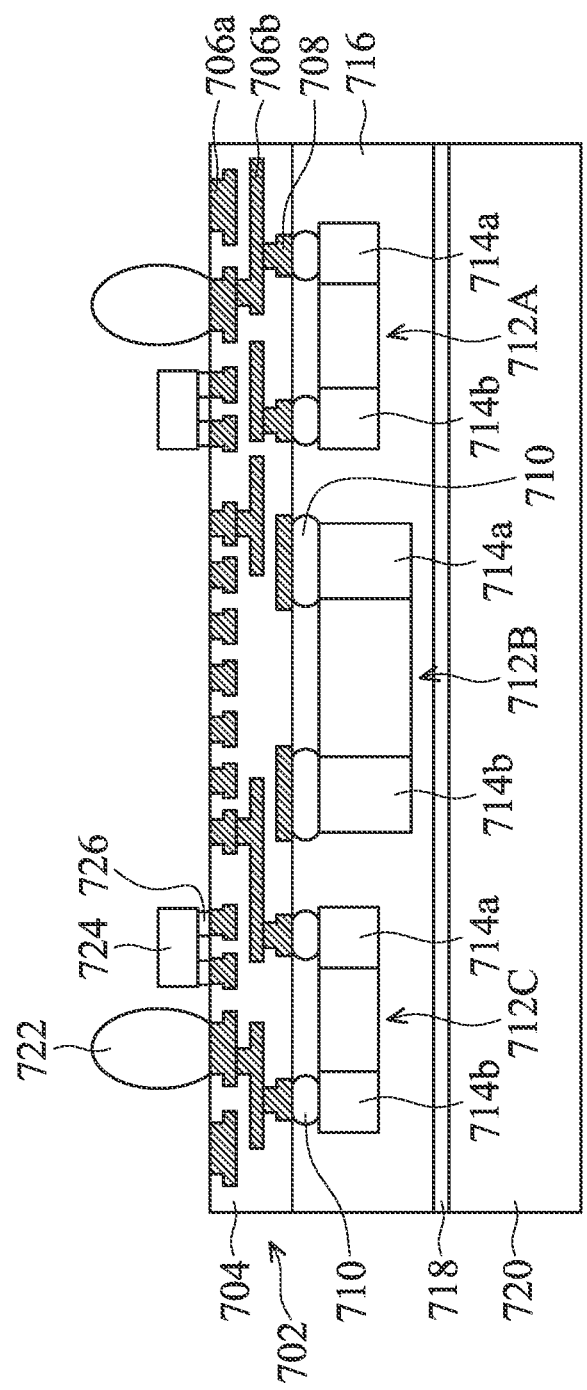

As shown in FIG. 7F, similar to the embodiments illustrated in FIG. 1B, conductive bumps 722 are formed over some of the conductive features 706a, in accordance with some embodiments. The material and formation method of the conductive bumps 722 may be the same as or similar to those of the conductive bumps 110 illustrated in FIG. 1B. Device elements 724 are bonded onto some of the conductive features 706a through solder elements 726. The device elements 724 may be similar to the device elements 112.

Figure 7G:
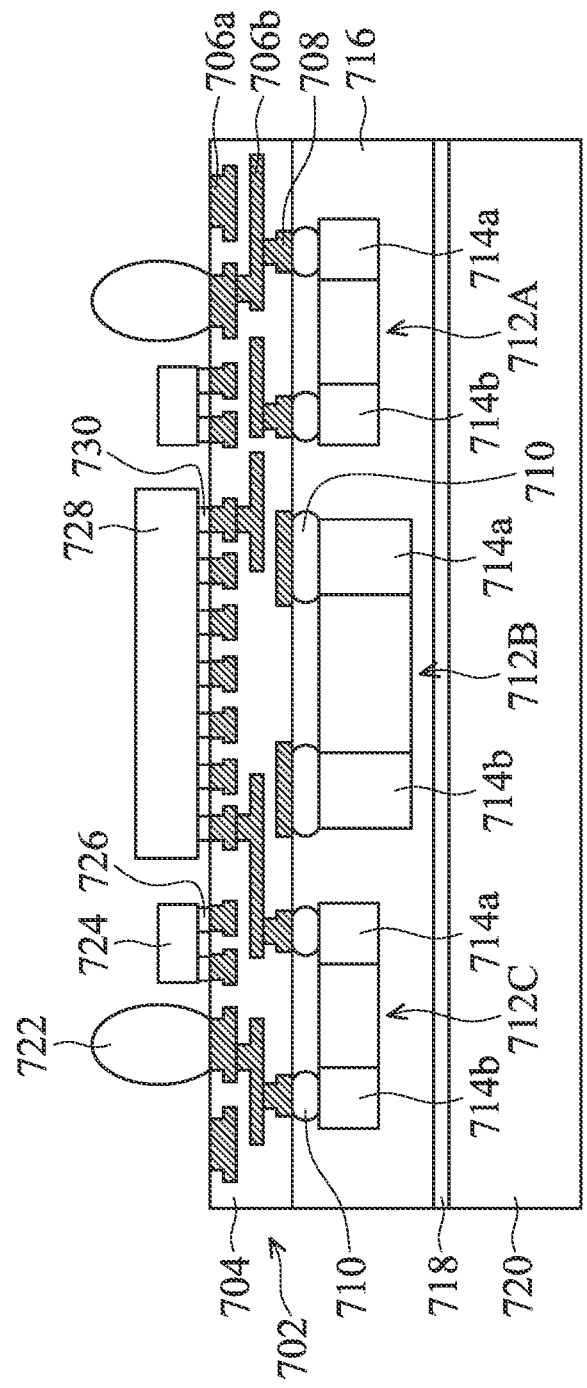

As shown in FIG. 7G, similar to the embodiments illustrated in FIG. 1C, a semiconductor die 728 is bonded onto some of the conductive features 706a through conductive features 730 of the semiconductor die 728, in accordance with some embodiments. The semiconductor die 728 may be similar to the semiconductor die 116.

Figure 7H:
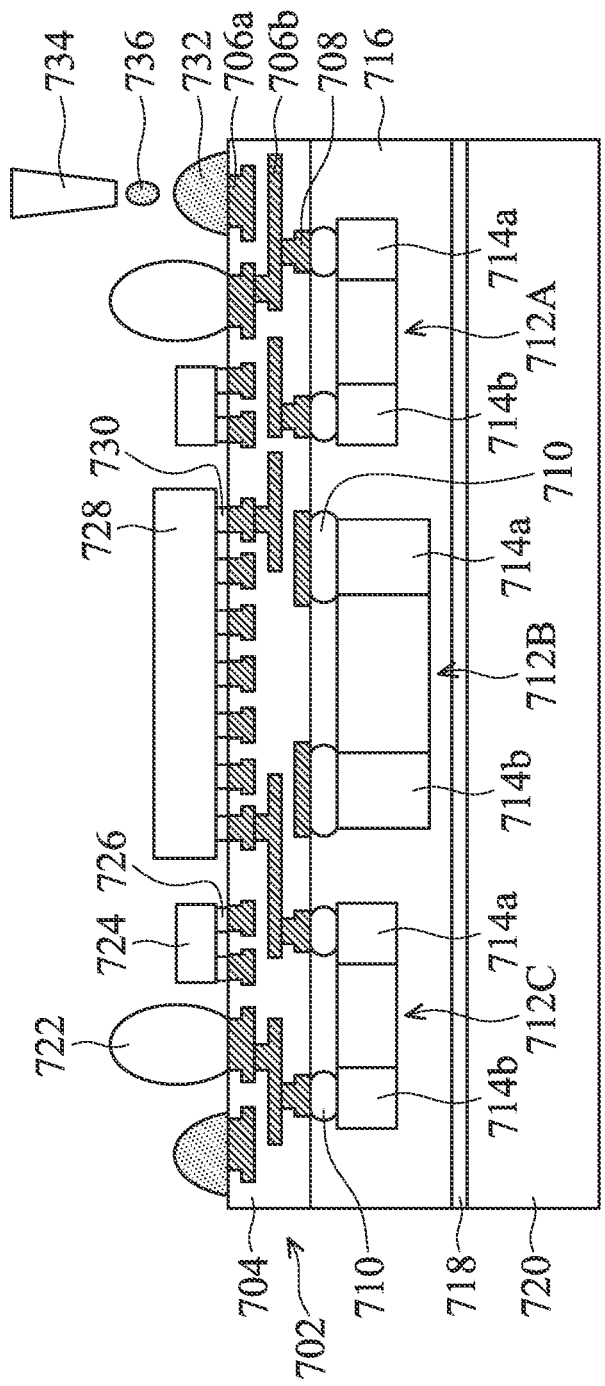

As shown in FIG. 7H, similar to the embodiments illustrated in FIG. 1D, a stiffener element 732 is formed over the redistribution structure 702, in accordance with some embodiments. The material and formation method of the stiffener element 732 may be the same as or similar to those of the stiffener element 120 illustrated in FIG. 1D. In some embodiments, a provider 734 is used to dispense a polymer-containing material 736 on the redistribution structure 702 for forming the stiffener element 732. Alternatively, in some other embodiments, the stiffener element 732 is a frame that is formed previously and is attached onto the redistribution structure 702 using a glue material.

Figure 7I:
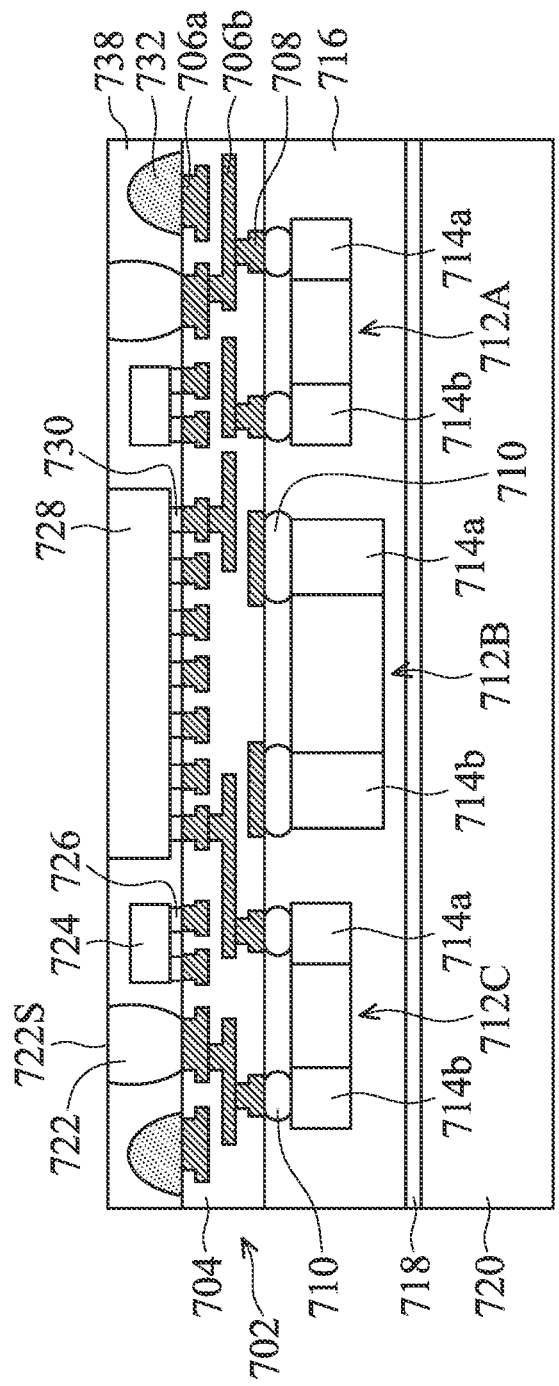

As shown in FIG. 7I, a protective layer 738 is formed to surround the semiconductor die 728, in accordance with some embodiments. The material and formation method of the protective layer 738 may be the same as or similar to those of the protective layer 126 illustrated in FIG. 1E.

In some embodiments, a planarization process is then used to provide the protective layer 738 with a substantially planar top surface. In some embodiments, the conductive bumps 722 are partially removed during the planarization process. As a result, surfaces 722S of the conductive bumps 722 are formed. In some embodiments, the surfaces 722S are substantially planar. In some embodiments, the surfaces 722S are substantially level with the top surface of the protective layer 738.

Figure 7J:
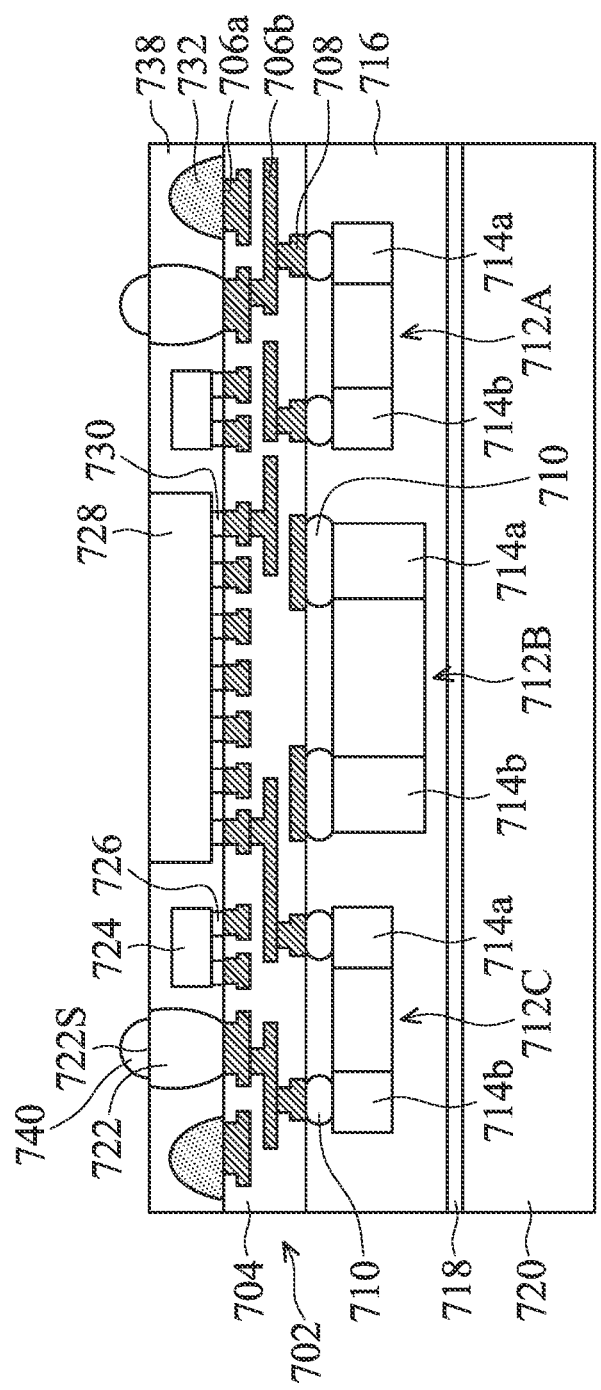

As shown in FIG. 7J, similar to the embodiments illustrated in FIG. 3A, solder elements 740 are formed over the surfaces 722S of the conductive bumps 722, in accordance with some embodiments. Afterwards, a thermal reflow process is used to reflow the solder elements 740 and the conductive bumps 722. As a result, conductive bumps 742 are formed, as shown in FIG. 7K in accordance with some embodiments.

In some other embodiments, each of the solder elements 740 is formed to have a larger volume. In these cases, after the thermal reflow process, each of the obtained conductive bumps 742 may have a gourd-like profile similar to the embodiments illustrated in in FIG. 1P.

Figure 7K:
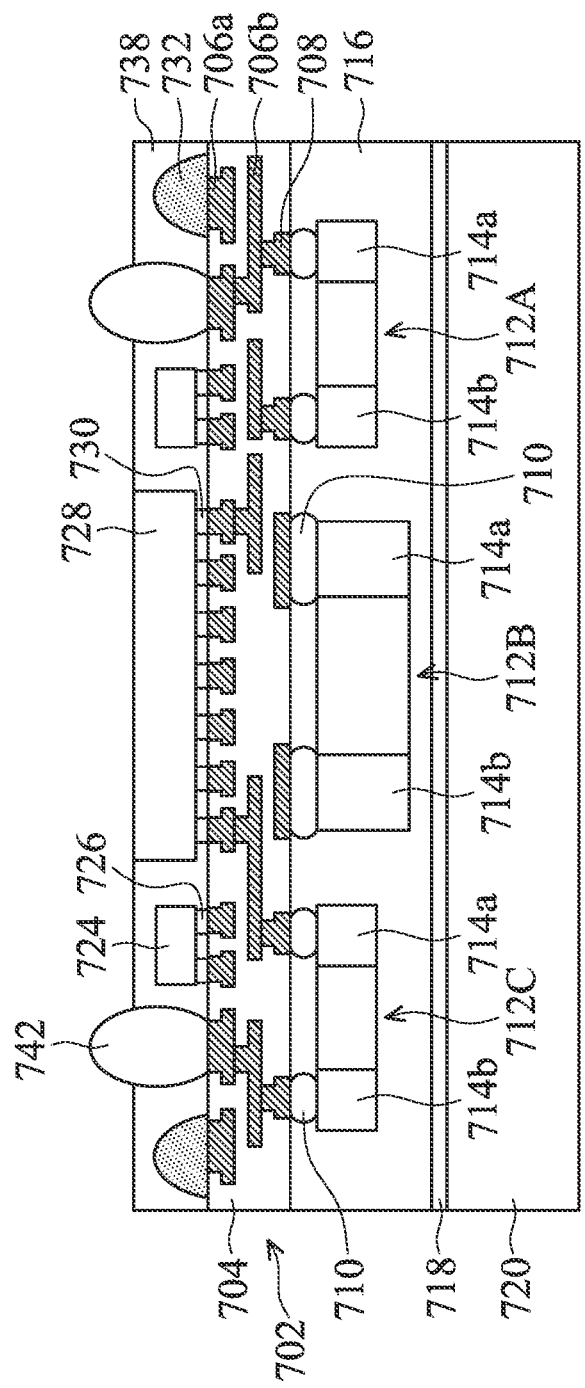
Figure 7L:
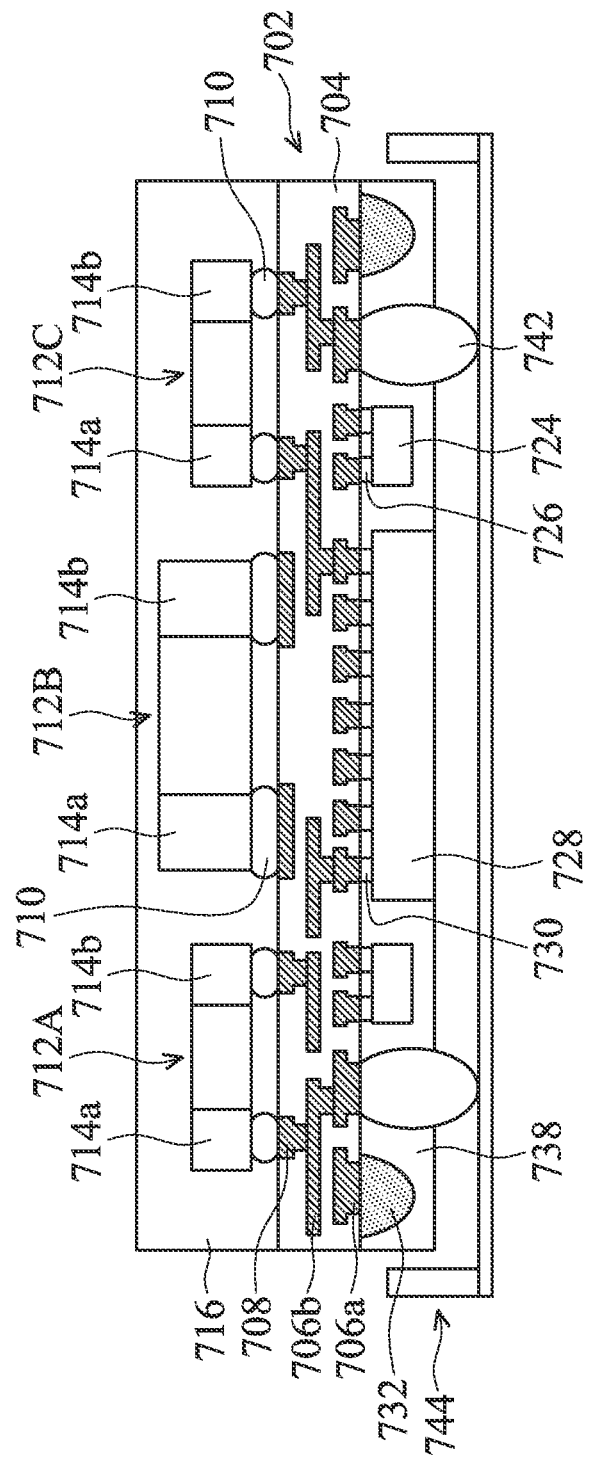

As shown in FIG. 7L, the structure shown in FIG. 7K is turned upside down and attached onto a frame carrier 744, in accordance with some embodiments. Afterwards, the adhesive layer 718 and the carrier substrate 720 are removed to expose the protective layer 716. Afterwards, a sawing process may be used to form multiple package structures separated from each other. These package structures may then be bonded onto another element such as a printed circuit board or an interposer substrate.

Figure 8A:
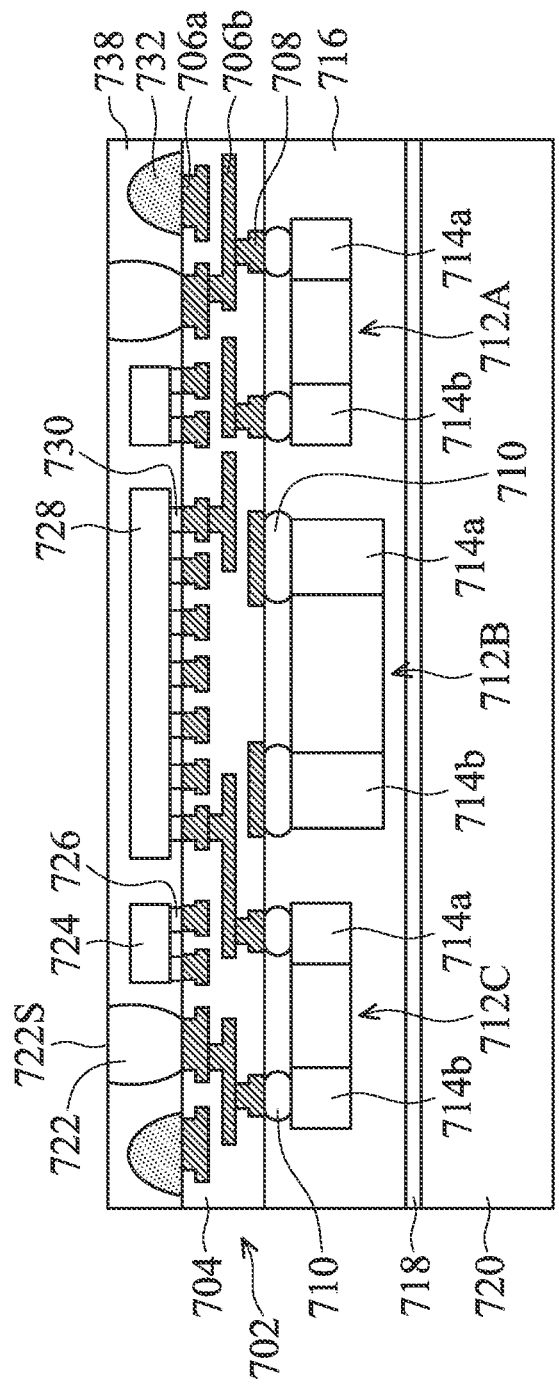
FIGS. 8A-8B are cross-sectional views of various stages of a process for forming a package structure, in accordance with some embodiments.
Figure 8B:
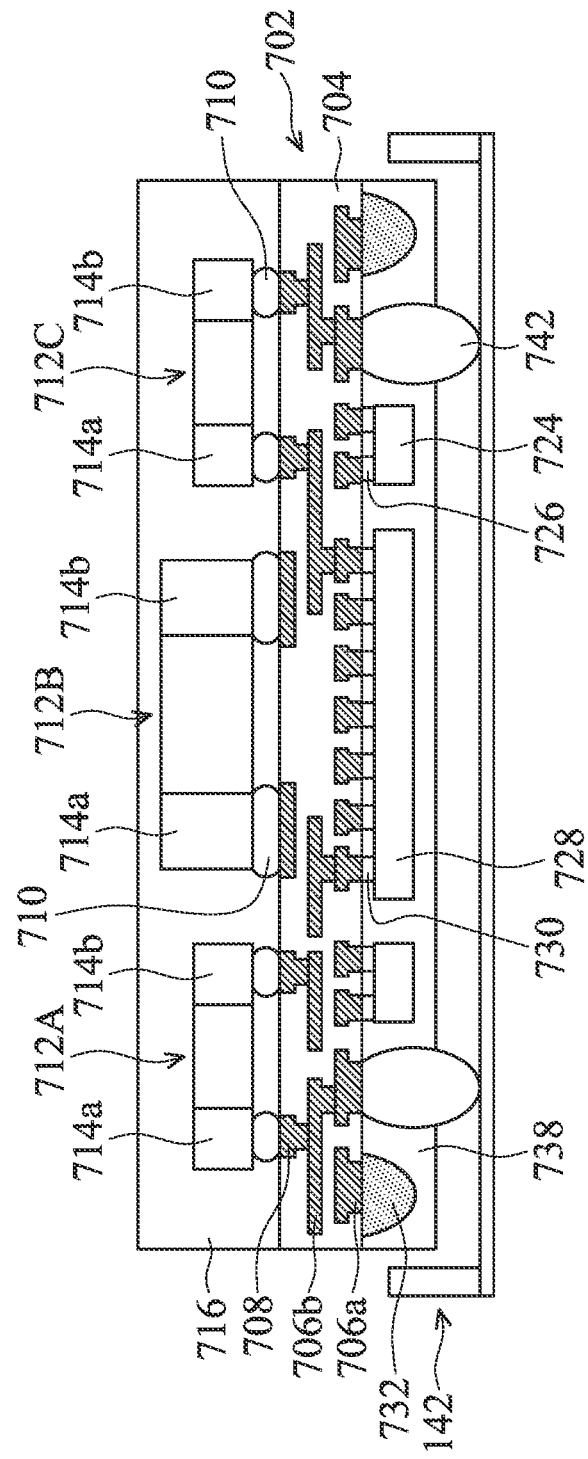

Many variations and/or modifications can be made to embodiments of the disclosure. FIGS. 8A-8B are cross-sectional views of various stages of a process for forming a package structure, in accordance with some embodiments.

As shown in FIG. 8A, a structure similar to that shown in FIG. 7I is received or formed. However, the protective layer 738 is planarized to expose and partially remove the conductive bumps 722 without exposing the semiconductor die 728. In these cases, the protective layer 738 covers the semiconductor die 728.

Afterwards, steps of the process that are similar to those illustrated in FIGS. 7J-7L are performed, in accordance with some embodiments. As a result, the structure shown in FIG. 8B is obtained. Afterwards, a sawing process may be used to form multiple package structures separated from each other. These package structures may then be bonded onto another element such as a printed circuit board or an interposer substrate.

Figure 10:
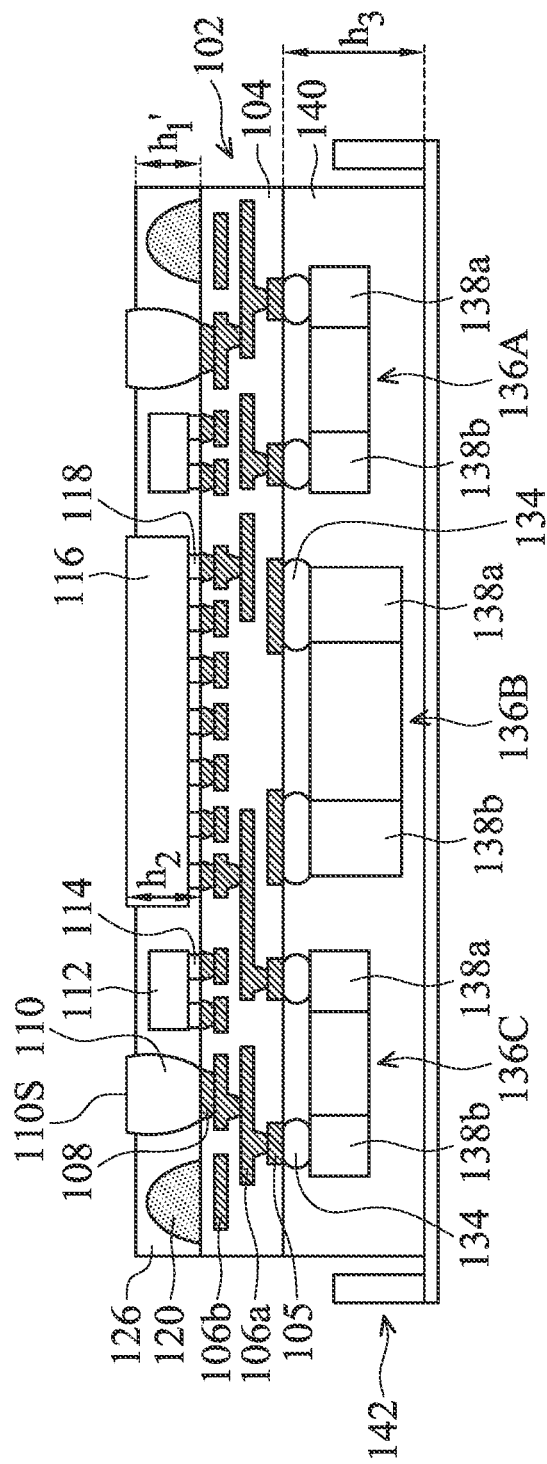
FIG. 10 is a cross-sectional view of a package structure, in accordance with some embodiments.

Many variations and/or modifications can be made to embodiments of the disclosure. FIG. 10 is a cross-sectional view of a package structure, in accordance with some embodiments. In some embodiments, the stiffener element 120 is formed on the surface of the redistribution structure 102 where the semiconductor die 116 is placed. In some embodiments, another stiffener element 120' is formed on the opposite surface of the redistribution structure 102. The material and formation method of the stiffener element 120' may be the same as or similar to those of the stiffener element 120. The stiffener element 120' may be formed after the disposing of the device elements 136A, 136B, and 136C and before the formation of the protective layer 140. Many variations and/or modifications can be made to embodiments of the disclosure. In some other embodiments, the stiffener element 120' is formed, and the stiffener element 120 is not.

Embodiments of the disclosure form a package structure with asymmetric protective layers over opposite surfaces of a redistribution structure. One of the protective layers is thinner and is used for protecting thinner elements such as a semiconductor die. Another protective layer is thicker and is used for protecting thicker elements such as surface mounted devices with passive elements. By using the thinner protective layer, the total thickness of the package structure may be reduced. The thinner protective layer is designed to have a greater coefficient of thermal expansion than that of the thicker protective layer. The thinner protective layer with the greater coefficient of thermal expansion may compensate the expansion of the thicker protective layer with the lower coefficient of thermal expansion. The warpage of the package structure that occurs during or after the fabrication processes may therefore be reduced. The quality and reliability of the package structure are significantly improved.

In accordance with some embodiments, a method for forming a package structure is provided. The method includes disposing a semiconductor die over a first surface of a redistribution structure. The method also includes forming a first protective layer to surround a portion of the semiconductor die. The method further includes disposing a device element over a second surface of the redistribution structure. The redistribution structure is between the device element and the semiconductor die. In addition, the method includes forming a second protective layer to surround a portion of the device element. The second protective layer is thicker than the first protective layer, and the second protective layer and the first protective layer have different coefficients of thermal expansion.

In accordance with some embodiments, a method for forming a package structure is provided. The method includes disposing a device element over a first surface of a redistribution structure. The method also includes forming a first protective layer to surround a portion of the device element. The method further includes disposing a semiconductor die over a second surface of the redistribution structure. The redistribution structure is between the device element and the semiconductor die, and the semiconductor die is thinner than the device element. In addition, the method includes forming a second protective layer to surround a portion of the semiconductor die. The second protective layer is thinner than the first protective layer, and the second protective layer and the first protective layer are made of different materials.

In accordance with some embodiments, a package structure is provided. The package structure includes a redistribution structure. The package structure also includes a semiconductor die and a device element over opposite surfaces of the redistribution structure. The package structure further includes a first protective layer surrounding a portion of the semiconductor die. In addition, the package structure includes a second protective layer surrounding a portion of the device element. The second protective layer is thicker than the first protective layer, and the second protective layer and the first protective layer have different coefficients of thermal expansion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a redistribution structure, wherein the redistribution structure has a plurality of insulating layers and a plurality of conductive features;
   a semiconductor die and a device element over opposite surfaces of the redistribution structure;
   a first protective layer at least partially surrounding the semiconductor die, wherein the semiconductor die protrudes from a top surface of the first protective layer;
   a conductive bump over the redistribution structure, wherein the first protective layer surrounds a lower portion of the conductive bump, an upper portion of the conductive bump protrudes from the top surface of the first protective layer, the upper portion of the conductive bump has a first curved sidewall curved outwards, the lower portion has a second curved sidewall, the first curved sidewall has a different curvature than that of the second curved sidewall, and the lower portion of the conductive bump gradually narrows along a direction towards the upper portion of the conductive bump;
   a second protective layer at least partially surrounding the device element, wherein the second protective layer is thicker than the first protective layer, and the second protective layer and the first protective layer have different coefficients of thermal expansion; and
   a stiffener element over the redistribution structure, wherein the first protective layer surrounds a lower portion of the stiffener element, the stiffener element has a first end and a second end, the first end is between the second end and the redistribution structure, the first end is wider than the second end, the stiffener element gradually narrows along a direction from the first end towards the second end, the stiffener element has a planar top surface, and the planar top surface is substantially level with a top of the semiconductor die.

2. The package structure as claimed in claim 1, wherein the device element is thicker than the semiconductor die.

3. The package structure as claimed in claim 1, wherein the first protective layer has a greater coefficient of thermal expansion than that of the second protective layer.

4. The package structure as claimed in claim 1, wherein the upper portion of the conductive bump extends laterally across an interface between the lower portion of the conductive bump and the first protective layer.

5. The package structure as claimed in claim 1, wherein a top of the semiconductor die is closer to the redistribution structure than a top of the conductive bump.

6. The package structure as claimed in claim 1, wherein the conductive bump is a tin-containing solder element, and the upper portion of the conductive bump extends across an interface between the first protective layer and the lower portion of the conductive bump.

7. The package structure as claimed in claim 1, further comprising:
a second device element between the semiconductor die and the lower portion of the conductive bump, wherein the first protective layer covers a top surface of the second device element.

8. The package structure as claimed in claim 1, wherein the stiffener element has a curved sidewall.

9. The package structure as claimed in claim 1, wherein the stiffener element gradually become wider along a first direction towards the redistribution structure, and the lower portion of the conductive bump gradually becomes narrower along a second direction away from the redistribution structure.

10. The package structure as claimed in claim 1, wherein the upper portion of the conductive bump is in direct contact with the top surface of the first protective layer.

11. A package structure, comprising:
a redistribution structure, wherein the redistribution structure has a plurality of insulating layers and a plurality of conductive features;
a semiconductor die bonded to the redistribution structure;
a first protective layer surrounding the semiconductor die, wherein the semiconductor die protrudes from a top surface of the first protective layer;
a conductive bump bonded to the redistribution structure, wherein the first protective layer surrounds a first portion of the conducive bump, a second portion of the conductive bump protrudes from the top surface of the first protective layer, the first portion has a first curved sidewall, the second portion has a second curved sidewall, the first curved sidewall has a different curvature than that of the second curved sidewall, the first portion of the conductive bump has an upper part and an intermediate part, the intermediate part is between the upper part and the redistribution structure, and the intermediate part is wider than the upper part;
a second protective layer over the redistribution structure, wherein the redistribution structure is between the first protective layer and the second protective layer, the second protective layer is thicker than the first protective layer, and the first protective layer has a greater coefficient of thermal expansion than that of the second protective layer; and
a stiffener element surrounded by the first protective layer, wherein the stiffener element is thicker than the first protective layer, the stiffener element is laterally spaced apart from the conductive bump, the stiffener element has a first end and a second end, the first end is between the second end and the redistribution structure, and the first end is wider than the second end, and the stiffener element is made of a polymer material.

12. The package structure as claimed in claim 11, wherein a cross-section of the conductive bump has a gourd profile.

13. The package structure as claimed in claim 11, wherein the first protective layer is thinner than the semiconductor die.

14. The package structure as claimed in claim 13, further comprising:

a device element bonded to the redistribution structure and surrounded by the second protective layer, wherein the device element is thicker than the first protective layer.

15. The package structure as claimed in claim 11, wherein a lower part of the first portion gradually becomes narrower along a direction towards the redistribution structure.

16. A package structure, comprising:
a redistribution structure, wherein the redistribution structure has a plurality of insulating layers and a plurality of conductive features;
a device element bonded to the redistribution structure;
a first protective layer over the redistribution structure;
a conductive bump bonded to the redistribution structure, wherein the first protective layer surrounds a first portion of the conducive bump, a second portion of the conductive bump protrudes from a top surface of the first protective layer, the first portion has a first sidewall that is curved, the first sidewall has a different curvature than that of a second sidewall of the second portion, and an upper part of the first portion becomes narrower along a direction towards the second portion of the conductive bump;
a second protective layer surrounding the device element, wherein the redistribution structure is between the first protective layer and the second protective layer, the second protective layer is thicker than the first protective layer, and the first protective layer has a greater coefficient of thermal expansion than that of the second protective layer; and
a stiffener element laterally spaced apart from the conductive bump and partially surrounded by the first protective layer, wherein the stiffener element has a curved sidewall, wherein the stiffener element has a first end and a second end, the first end is between the second end and the redistribution structure, and the first end is wider than the second end, wherein the stiffener element is made of a polymer material.

17. The package structure as claimed in claim 16, wherein a cross-section of the conductive bump has a gourd profile.

18. The package structure as claimed in claim 16, further comprising:
a circuit board bonded to the redistribution structure through the conductive bump, wherein the semiconductor die is between the circuit board and the redistribution structure, the first protective layer is in direct contact with the semiconductor die, and thicknesses of the first protective layer and the semiconductor die are different from each other.

19. The package structure as claimed in claim 16, wherein the second portion of the conductive bump is in direct contact with the top surface of the first protective layer.

20. The package structure as claimed in claim 16, wherein the second portion of the conductive bump has a top end and a bottom end, the top end is between the bottom end and the first protective layer, and the top end is wider than the first portion of the conductive bump.

* * * * *